(12) United States Patent
Masunaga et al.

(10) Patent No.: US 8,685,629 B2
(45) Date of Patent: Apr. 1, 2014

(54) RESIST PATTERN FORMING PROCESS

(75) Inventors: Keiichi Masunaga, Joetsu (JP); Takeru Watanabe, Joetsu (JP); Satoshi Watanabe, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1 day.

(21) Appl. No.: 13/362,294

(22) Filed: Jan. 31, 2012

(65) Prior Publication Data

US 2012/0196211 A1  Aug. 2, 2012

(30) Foreign Application Priority Data

Jan. 31, 2011 (JP) ................................. 2011-017840

(51) Int. Cl.
*G03F 7/26* (2006.01)

(52) U.S. Cl.
USPC .................... 430/322; 430/330; 430/270.1

(58) Field of Classification Search
USPC .................................. 430/322, 270.1, 330, 5
See application file for complete search history.

(56) References Cited

U.S. PATENT DOCUMENTS

| | | | |
|---|---|---|---|
| 7,537,880 B2 | 5/2009 | Harada et al. | |
| 7,803,511 B2 | 9/2010 | Inabe et al. | |
| 7,875,420 B2 | 1/2011 | Inatomi | |
| 2003/0171490 A1 | 9/2003 | Breyta et al. | |
| 2005/0079446 A1* | 4/2005 | Hatakeyama et al. | 430/281.1 |
| 2009/0274978 A1 | 11/2009 | Ohashi et al. | |
| 2010/0009299 A1 | 1/2010 | Watanabe et al. | |
| 2010/0261123 A1* | 10/2010 | Tanaka et al. | 430/325 |
| 2010/0304302 A1 | 12/2010 | Masunaga et al. | |

FOREIGN PATENT DOCUMENTS

| | | |
|---|---|---|
| EP | 2239631 A1 | 10/2010 |
| EP | 2256551 A1 | 12/2010 |
| JP | 2001-226430 A | 8/2001 |
| JP | 2005-019969 A | 1/2005 |
| JP | 2007-52346 A | 3/2007 |
| JP | 2008-111103 A | 5/2008 |
| JP | 2009-269953 A | 11/2009 |
| JP | 2010-164933 A | 7/2010 |
| JP | 2010-243873 A | 10/2010 |
| JP | 2011-113034 A | 6/2011 |
| WO | 2010/035908 A1 | 4/2010 |
| WO | 2011/083872 A1 | 7/2011 |

OTHER PUBLICATIONS

European Search Report dated May 16, 2012, issued in corresponding European Patent Application No. 12153137.0 (8 pages).
Japanese Office Action dated Apr. 23, 2013, issued in corresponding Japanese Patent Application No. 2011-017840.

* cited by examiner

*Primary Examiner* — Cynthia Kelly
*Assistant Examiner* — Caleen Sullivan
(74) *Attorney, Agent, or Firm* — Westerman, Hattori, Daniels & Adrian, LLP

(57) ABSTRACT

A resist pattern is formed by coating a chemically amplified positive resist composition onto a substrate and prebaking to form a resist film, exposing to high-energy radiation, baking and developing with a developer to form a resist pattern, and heating the pattern for profile correction to such an extent that the line width may not undergo a change of at least 10%. An amount of a softening accelerator having a molecular weight of up to 800 is added to the resist composition comprising (A) a base resin, (B) an acid generator, (C) a nitrogen-containing compound, and (D) an organic solvent.

8 Claims, No Drawings

RESIST PATTERN FORMING PROCESS

CROSS-REFERENCE TO RELATED APPLICATION

This non-provisional application claims priority under 35 U.S.C. §119(a) on Patent Application No. 2011-017840 filed in Japan on Jan. 31, 2011, the entire contents of which are hereby incorporated by reference.

TECHNICAL FIELD

This invention relates to a pattern forming process using a chemically amplified resist composition, and more particularly, to such a process including the steps of developing an exposed resist to form a resist pattern and correcting the profile of the resist pattern.

BACKGROUND ART

While the pattern rule is made drastically finer in the recent drive for higher integration densities and operating speeds in LSI devices, the deep-UV lithography using KrF or ArF excimer laser light is currently utilized as the mainstream micropatterning technology. Since the deep-UV lithography using chemically amplified resist compositions is capable of processing to 0.2 µm or less, it has been industrially utilized to process a pattern with a feature size of less than 65 nm. With respect to the EB lithography, when it is combined with chemically amplified resist compositions, a practically acceptable sensitivity has been achieved despite the use of higher energy EB. The EB lithography is thus expected to have a finer processing ability. With respect to the EUV lithography, the use of chemically amplified resist compositions is believed essential for gaining a practically acceptable sensitivity.

In the course of development of such chemically amplified positive resist compositions, addition of various resist components and modifications thereof have been proposed in order to overcome many problems including resolution, sensitivity, pattern profile, PED (post-exposure delay or a change of pattern profile with standing time following exposure), and substrate poisoning. In particular, a problem that the profile of a resist pattern as developed is roughened at the edge is known as "line edge roughness" (LER), with the continuing demand for improvement in this problem. In particular, the photomask for use in photolithography must be processed to a profile having an OPC (optical proximity correction) applied thereto in order to restrain degradation of the contrast of irradiated pattern profile by light diffraction. This requires the pattern profile during processing to be substantially reduced in LER.

In the early stage, LER improvements are made by increasing both the quantities of acid generator and basic substance added. This approach alone is difficult to accommodate an attempt to form a fine pattern having a line width of less than 65 nm. Also, as the thickness of a resist film from which a resist pattern is formed is reduced to 150 nm or less, especially 100 nm or less, heterogeneous zones known as "micro-grains" are sometimes formed in the film. It is pointed out in JP-A 2010-243873 that the micro-grain is one of the causes for LER.

Methods for improving LER include pattern correction after development. JP-A 2005-19969 proposes a method of performing pattern correction after development by feeding a solvent gas to a resist pattern as developed for dissolving the resist surface. The development assembly must be equipped with a unit for feeding a solvent gas to the resist pattern and a unit for recovering the solvent gas. A method for performing pattern correction without addition of such units is by adding a minor amount of a high boiling solvent to a resist composition, forming a pattern therefrom, and heating the pattern for profile correction as disclosed in JP-A 2010-243873.

CITATION LIST

Patent Document 1: JP-A 2010-243873 (EP 2239631, US 20100261123)
Patent Document 2: JP-A 2005-19969
Patent Document 3: EP 2256551 or US 20100304302
Patent Document 4: JP-A 2008-111103 (U.S. Pat. No. 7,537,880)
Patent Document 5: JP-A 2010-164933
Patent Document 6: JP-A 2009-269953
Patent Document 7: JP-A 2001-226430

SUMMARY OF INVENTION

As the integration density of integrated circuits increases, there is a stronger demand for resist patterns with a higher accuracy. Further improvement in LER is one of important tasks.

The LER improvement of Patent Document 1 is a method which is viable with a minor change of the existing resist composition. However, the result may vary with resist film depositing conditions and pattern forming conditions. It would be desirable to have an alternative.

An object of the invention is to provide a resist pattern forming process using a chemically amplified resist composition which is adapted for the micropatterning photolithography, specifically lithography using KrF laser, ArF laser, $F_2$ laser, EUV, EB, or x-ray and which forms a pattern of a satisfactory profile while improving its LER.

The inventors have found that LER can be improved in a consistent manner by adding a softening accelerator to a resist composition, developing to form a pattern, and effecting heat treatment on the pattern.

In one aspect, the invention provides a resist pattern forming process comprising the steps of:

(i) coating a chemically amplified positive resist composition onto a processable substrate, the resist composition comprising (A) a base resin having an acidic functional group protected with an acid labile group, which is substantially alkali insoluble, but turns alkali soluble when the acid labile group is eliminated, (B) an acid generator, (C) a nitrogen-containing compound as a basic component, and (D) an organic solvent, and prebaking to remove an excess of the solvent and form a resist film, (ii) exposing the resist film imagewise to high-energy radiation, (iii) optionally baking and developing with a developer to form a resist pattern, and (iv) heating the developed pattern for pattern profile correction to such an extent that the line width of the developed pattern may not undergo a change of at least 10%, the resist composition further comprising (E) a softening accelerator having an acidic functional group protected with an acid labile group and a molecular weight of up to 800 in an amount of 2.5% to 20% by weight based on the total solids of the resist composition.

In a preferred embodiment, the softening accelerator is a compound having at least two 5 or 6-membered rings and a free-rotatable carbon chain of at least two carbon atoms.

More preferably, the softening accelerator is a compound having the general formula (1):

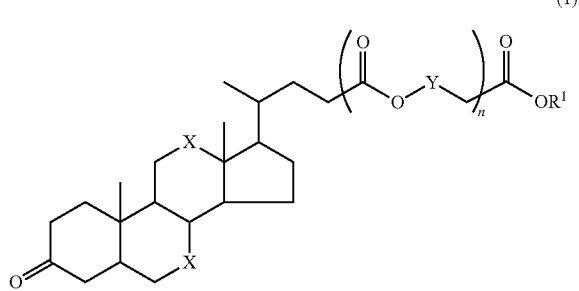
(1)

wherein $R^1$ is such an acid labile group having 2 to 20 carbon atoms and optional oxygen atom that —COOR$^1$ is decomposed to generate carboxyl under the action of acid, X is each independently a carbonyl group (—CO—) or methylene group (—CH$_2$—), Y is each independently a single bond or a $C_1$-$C_6$ alkylene group, and n is an integer of 0 to 2.

Preferably, $R^1$ in formula (1) is an acetal group having the general formula (2):

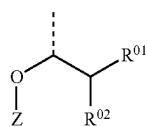
(2)

wherein the broken line denotes a valence bond, $R^{01}$ and $R^{02}$ are each independently hydrogen or a straight, branched or cyclic $C_1$-$C_{10}$ alkyl group, or $R^{01}$ and $R^{02}$ may bond together to form a cyclic structure with the carbon atom to which they are attached, and Z is a monovalent $C_1$-$C_{20}$ hydrocarbon group which may contain an oxygen atom.

In a more preferred embodiment, the softening accelerator has the general formula (3):

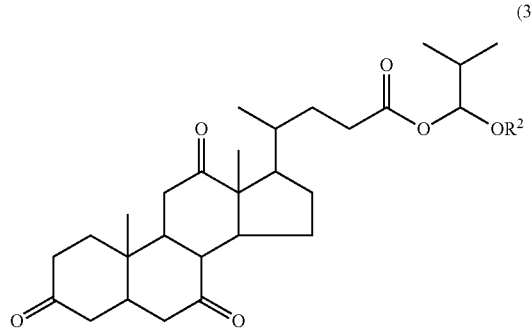
(3)

wherein $R^2$ is a straight, branched or cyclic monovalent hydrocarbon group which may contain an oxygen atom and in which the sum of carbon and oxygen atoms is 1 to 15.

Typically, the processable substrate is a photomask blank.

Advantageous Effect of Invention

The resist pattern forming process is characterized in that a softening accelerator having a molecular weight of up to 800 is present in a resist pattern obtained after development. By heating in a practically appropriate temperature range, the resist pattern as developed is subjected to thermal deformation to such an extent that the line width of the pattern may not undergo a change of at least 10%, whereby the resist pattern profile is corrected for minor asperities in a consistent manner. The process is successful in readily forming a resist pattern requiring a more strictly configured profile such as an OPC pattern.

DESCRIPTION OF EMBODIMENTS

The singular forms "a," an and the include plural referents unless the context clearly dictates otherwise. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group. The broken line depicted in a chemical formula denotes a valence bond.

The abbreviations and acronyms have the following meaning.
UV: ultraviolet radiation
deep-UV: deep ultraviolet
EUV: extreme ultraviolet
EB: electron beam
Mw: weight average molecular weight
Mn: number average molecular weight
Mw/Mn: molecular weight distribution or dispersity
GPC: gel permeation chromatography
PEB: post-exposure bake
LER: line edge roughness As used herein, the term "substantially insoluble" means that a polymer is insoluble or difficulty soluble in an alkaline developer.

As alluded to in Patent Document 1, the "thermal flow" process is known in the art. In an attempt to form a microscopic hole pattern which is difficult to form directly, for example, once a resist pattern which is larger than the desired pattern is formed, the resist pattern is heated above the thermal fluidization temperature of the resist polymer for changing the size of the pattern. The resist pattern forming process of the invention is distinguished from the thermal flow process in that a resist pattern as developed is heated to such an extent that the size of the resist pattern may not be substantially changed, that is, the line width of the pattern as developed may not undergo a change of at least 10%, preferably at least 5%. This moderate heating improves only LER without degrading the pattern profile.

In order that the resist pattern forming process of the invention be implemented, it is necessary to ensure a sufficient resolution for the desired resist pattern and to induce consistent pattern deformation in an appropriate temperature range. If an attempt is made to induce thermal deformation only by heat without a choice of a material suitable for thermal deformation, it is difficult to improve LER without significant degradation of the pattern profile including pattern line width.

In conjunction with the LER improvement by heating after pattern formation as described in Patent Document 1, the inventors made investigations to achieve such an improvement via thermal deformation of a polymer. In the case of a photoresist composition based on polyhydroxystyrene, for example, it is known that a polyhydroxystyrene having a greater dispersity has a lower thermal fluidization temperature. It is also known that if a resist polymer has a greater dispersity, resolution and pattern profile are degraded. Then the inventors attempted to adjust the thermal deformation temperature of a resist polymer designed for high resolution, by adding thereto a compound having appropriate interaction with the polymer and a lower molecular weight than the polymer as a softening accelerator. It has been found that the object is attained by adding a softening accelerator as defined below to a resist composition in an amount of 2.5% to 20% by weight based on the solids in the composition. By heating in a controllable temperature span after pattern formation, the resist pattern can be fully improved in LER without detracting from high resolution.

The softening accelerator used herein is a compound having an acidic functional group protected with an acid labile group and a molecular weight of up to 800, specifically, a compound having at least two 5 or 6-membered rings, i.e., at least two rings of 5 or 6 carbon atoms. Such a compound is preferably selected from those molecules having at least two phenol structures and protected with an acid labile group (known as ballast molecules) which are used in novolac resist compositions along with quinonediazide and those molecules used in chemically amplified resist compositions as dissolution inhibitor (DRI). Since these materials have a relatively high interaction with polymers due to their carbocyclic structure, they cause no substantial resolution degradation during resist pattern formation and allow for thermal deformation of the pattern in a moderate temperature range.

The softening accelerator is preferably selected from aromatic structure-bearing compounds such as bisphenols, low molecular weight polyhydroxystyrenes with a molecular weight of up to 800, and bisphenol acid esters, which are protected with an acid labile group, and aromatic structure-free compounds such as sesquiterpenes, diterpenes, triterpenes and derivatives thereof having at least two rings and acid labile group-protected carboxylic acid. Inter alia, derivatives having a free-rotatable carbon chain of at least two carbon atoms are effective for moderately reducing the thermal fluidization temperature of resist polymers.

More preferably the softening accelerator is a compound having the general formula (1):

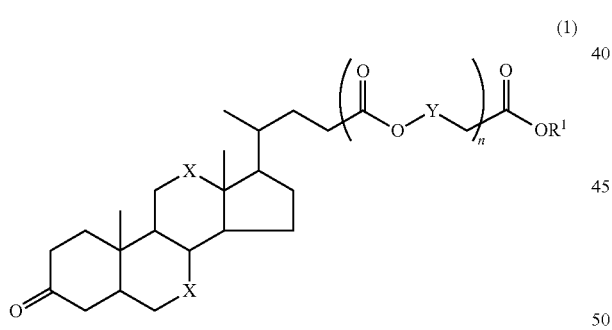

(1)

wherein $R^1$ is such an acid labile group having 2 to 20 carbon atoms and optional oxygen atom that —$COOR^1$ is decomposed to generate carboxyl under the action of acid, X is each independently a carbonyl group (—CO—) or methylene group (—$CH_2$—), Y is each independently a single bond or a $C_1$-$C_6$ alkylene group, and n is an integer of 0 to 2.

In formula (1), $R^1$ is such an acid labile group that —$COOR^1$ is decomposed to generate carboxyl under the action of acid. The acid labile group $R^1$ contains 2 to 20 carbon atoms and optionally, an oxygen atom, and may contain a multiple bond, or a hydroxyl, carbonyl, ester or ether moiety. When the sum of carbon and oxygen atoms in $R^1$ is 6 or more, benefits of further improved resolution and efficient coating are available. If the sum of carbon and oxygen atoms in $R^1$ exceeds 20, deleterious effects such as excessive acid diffusion may occur, resulting in degraded resolution and less rectangular pattern. Examples of acid labile group $R^1$ include common groups such as methoxymethyl, 1-ethoxyethyl, t-butyl, and t-amyl. Examples of the preferred acid labile group in which the sum of carbon and oxygen atoms is 6 to 20 include the following structures, but are not limited thereto. Notably the broken line denotes a valence bond.

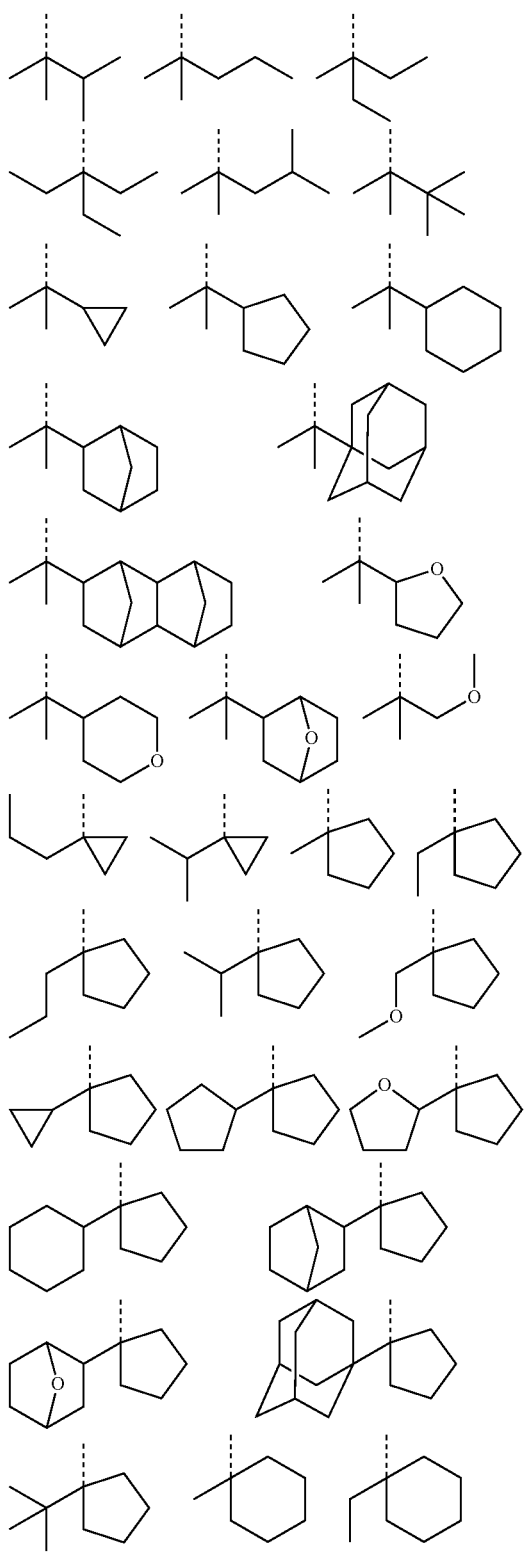

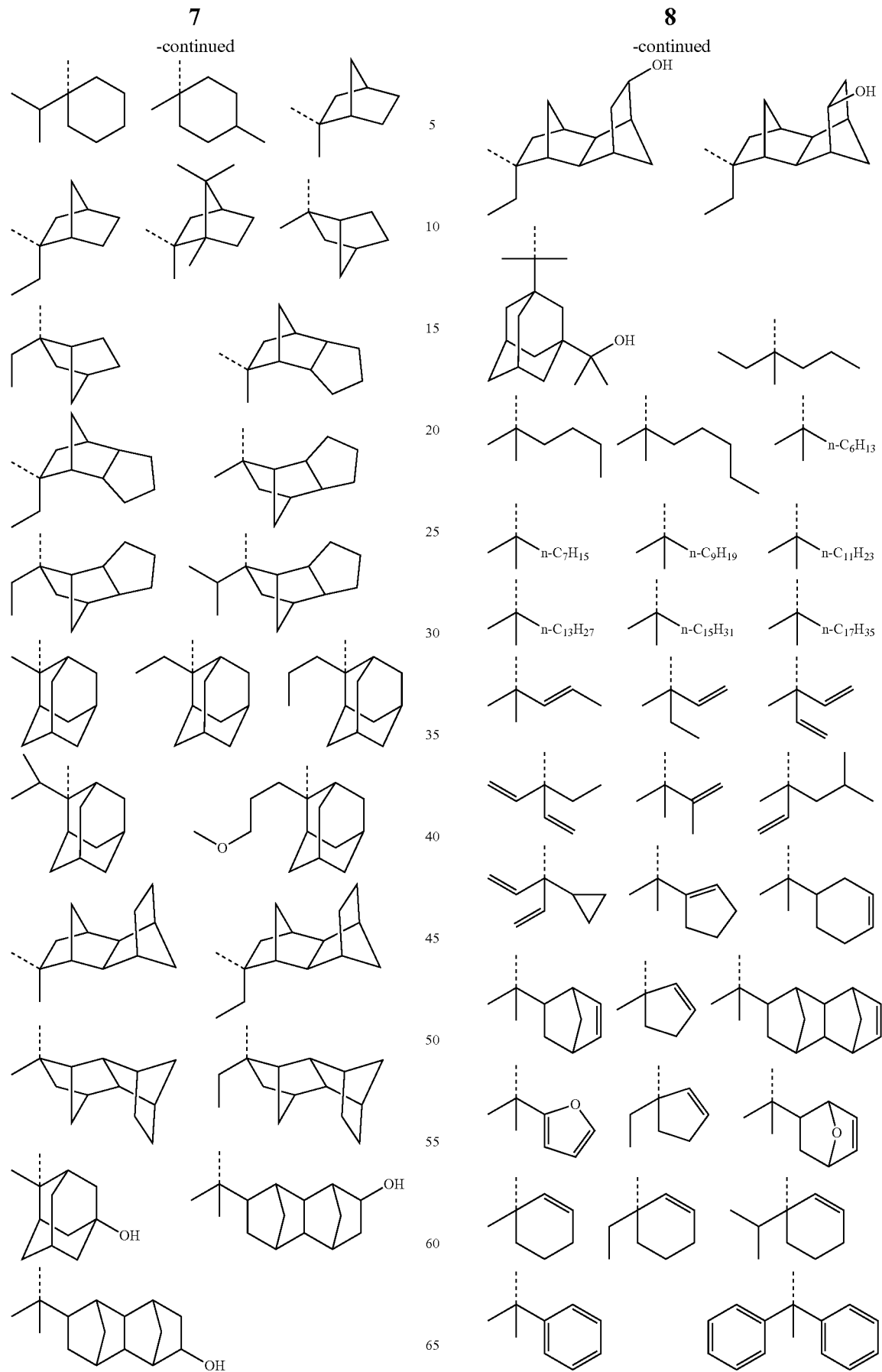

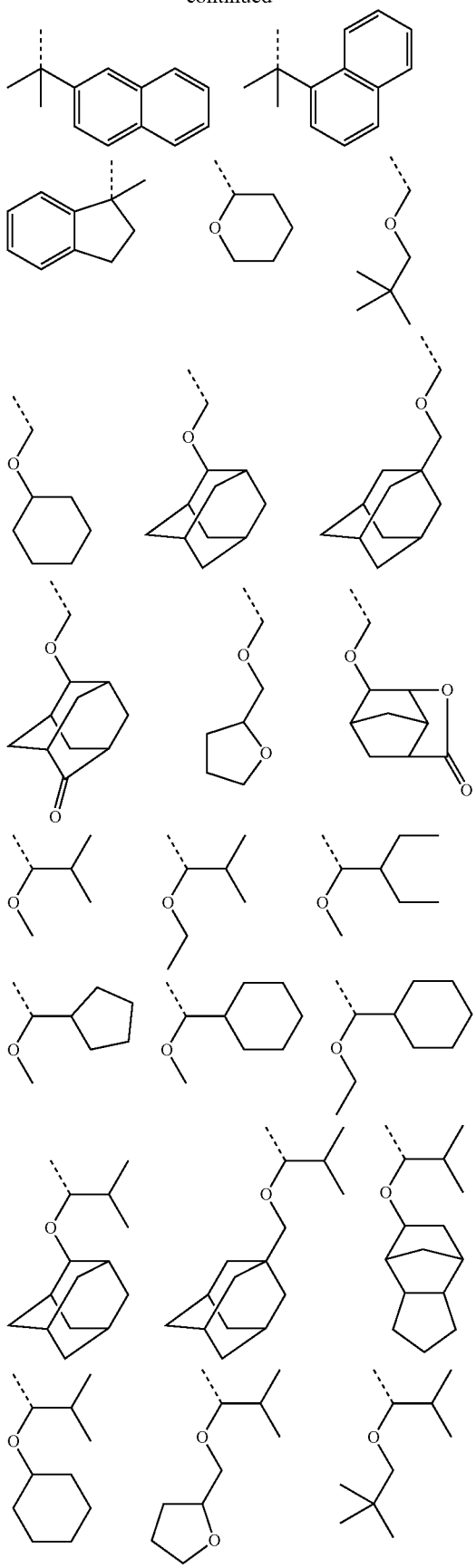
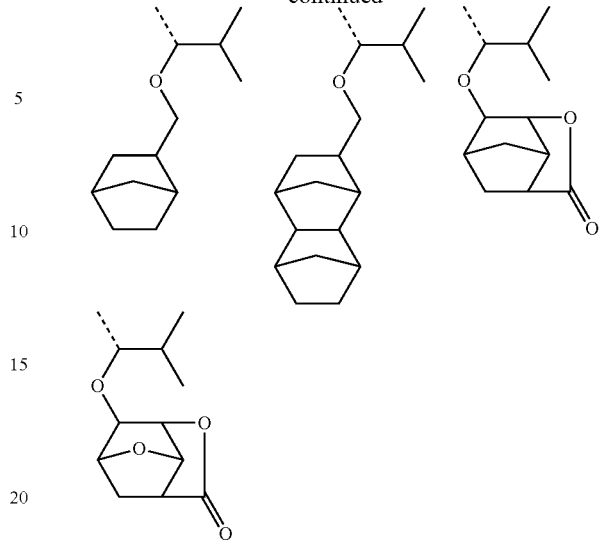

In formula (1), X is each independently a carbonyl group (—CO—) or methylene group (—CH$_2$—). Preferably, two X's are both carbonyl (—CO—). Y is each independently a single bond or a C$_1$-C$_6$ alkylene group, and preferably a single bond. Examples of Y include, but are not limited to, a single bond, methylene, ethylene, trimethylene, tetramethylene, pentamethylene, hexamethylene, propylene, ethylethylene, ethylidene, and isopropylidene. The subscript n is an integer of 0 to 2, preferably n=0 or 1, and most preferably n=0.

When the compound of formula (1) is used as a softening accelerator, R$^1$ in formula (1) is preferably an acetal group having the general formula (2):

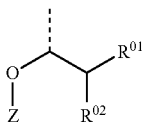

(2)

wherein R$^{01}$ and R$^{02}$ are each independently hydrogen or a straight, branched or cyclic C$_1$-C$_{10}$ alkyl group, or R$^{01}$ and R$^{02}$ may bond together to form a cyclic structure with the carbon atom to which they are attached, and Z is a monovalent C$_1$-C$_{20}$ hydrocarbon group which may contain an oxygen atom.

Notably some preferred examples of the acetal group are already shown in the above list of structural formulae. R$^{01}$ and R$^{02}$ are each independently hydrogen or a straight, branched or cyclic C$_1$-C$_{10}$ alkyl group, such as methyl, ethyl, propyl, or butyl. R$^{01}$ and R$^{02}$ may bond together to form a cyclic structure with the carbon atom to which they are attached, with exemplary rings including cyclopentane, cyclohexane, and cycloheptane. It is most preferred that neither R$^{01}$ nor R$^{02}$ be hydrogen, that is, the carbon to which R$^{01}$ and R$^{02}$ are attached be methine, because a resist composition is endowed with shelf stability.

Z is a monovalent C$_1$-C$_{20}$ hydrocarbon group which may contain an oxygen atom. Preferred aliphatic hydrocarbon groups include alkyl groups such as methyl, ethyl, propyl, butyl, pentyl, hexyl, heptyl, octyl, and structural isomers thereof, monocyclic alicyclic groups such as cyclopentyl, cyclohexyl, and cycloheptyl, polycyclic alicyclic groups such as adamantyl, norbornyl, norbornylmethyl, tricyclodecanyl, tetracyclododecanyl, tetracyclodecanylmethyl, and tetrahydrofurfuryl, and aromatic ring-containing hydrocarbon groups such as benzyl and phenethyl. The foregoing hydrocarbon groups may contain an oxygen atom to form an ether chain or a ring containing ether bond, or an ester structure or a ring containing ester structure such as a lactone ring or the like.

Examples of the acid-decomposable keto ester compound of steroid skeleton having formula (1) include, but are not limited to, the following compounds as well as examples of the compounds having formulae (1a) and (3) which will be illustrated later.

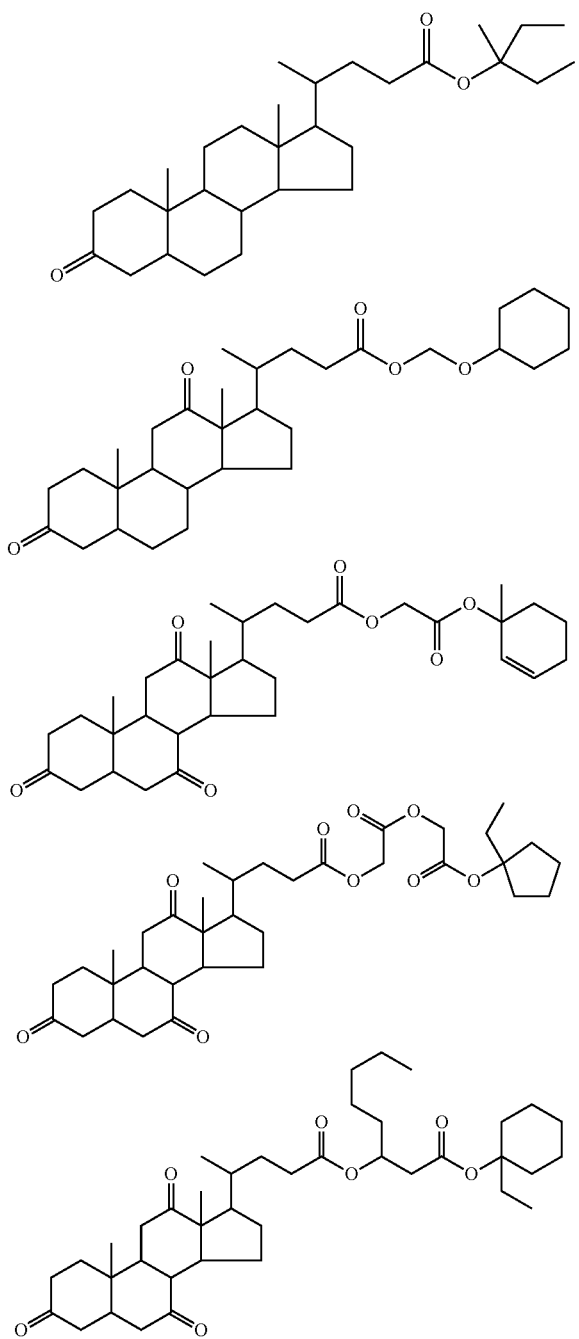

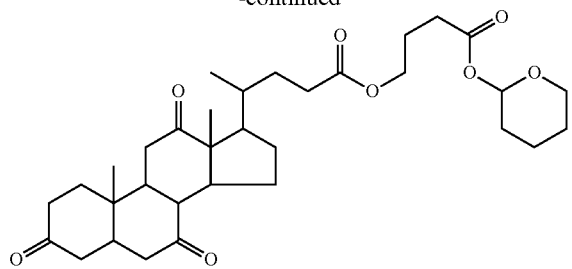

Preferably the acid-decomposable keto ester compound of steroid skeleton having formula (1) to be added to the chemically amplified positive resist composition of the invention is an acid-decomposable keto ester compound of steroid skeleton having the general formula (1a):

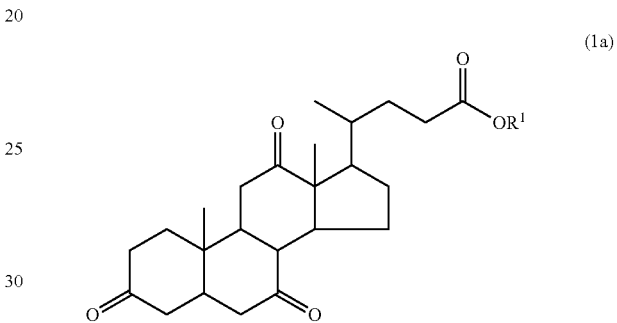

(1a)

wherein $R^1$ is such an acid labile group having 6 to 20 carbon and oxygen atoms in total that —$COOR^1$ is decomposed to generate carboxyl under the action of acid. In formula (1a), $R^1$ is as defined and illustrated above.

Examples of the acid-decomposable keto ester compound of steroid skeleton having formula (1a) include, but are not limited to, the following compounds as well as examples of the compound having formula (3) which will be illustrated later.

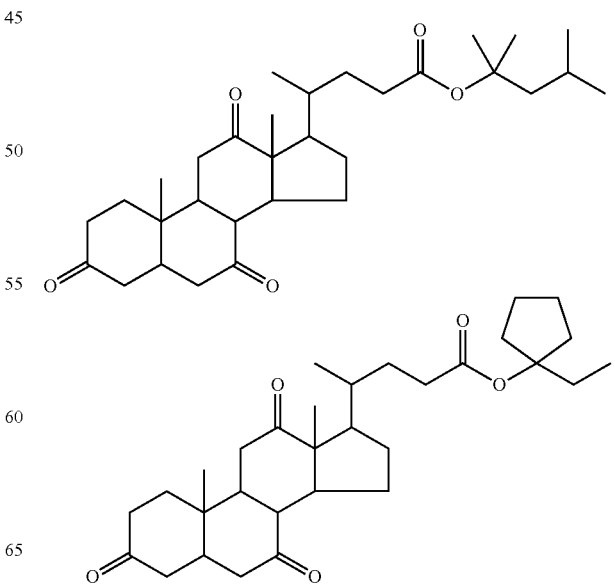

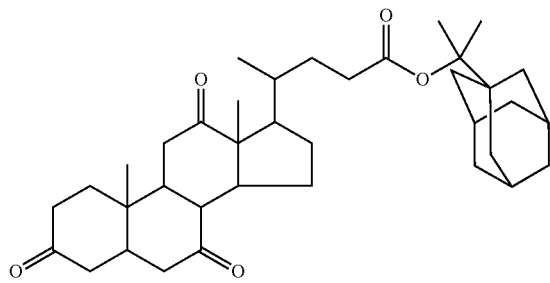

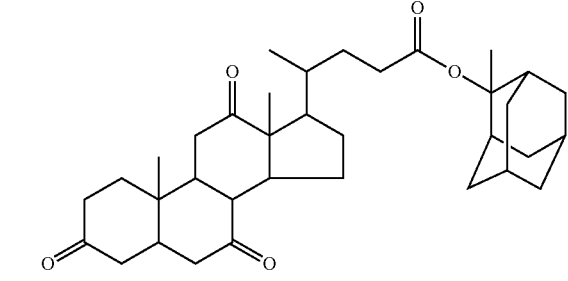

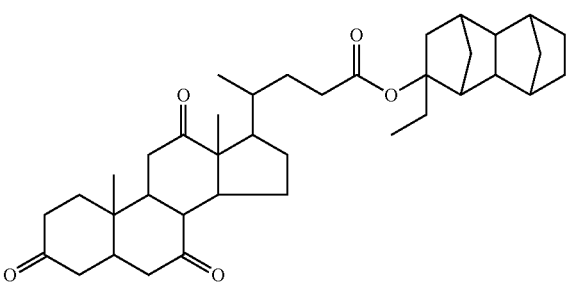

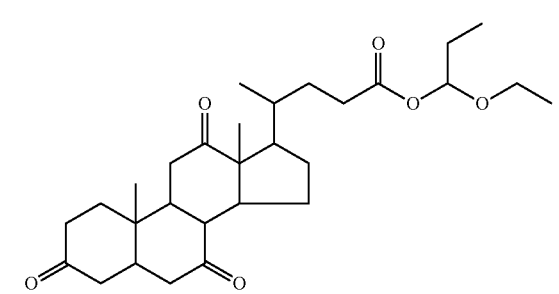

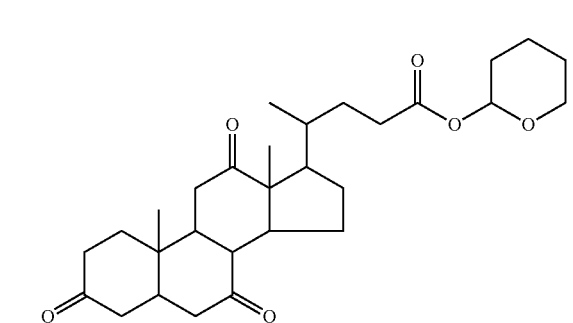

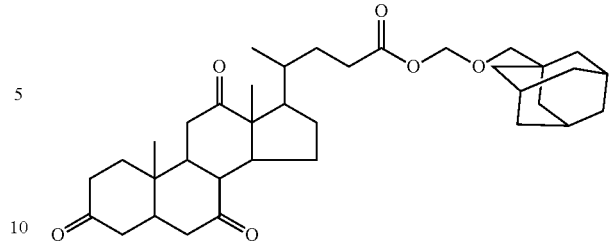

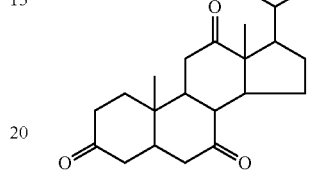

More preferably the acid-decomposable keto ester compound of steroid skeleton having formula (1) or (1a) to be added to the chemically amplified positive resist composition of the invention is an acid-decomposable keto ester compound of steroid skeleton having the general formula (3):

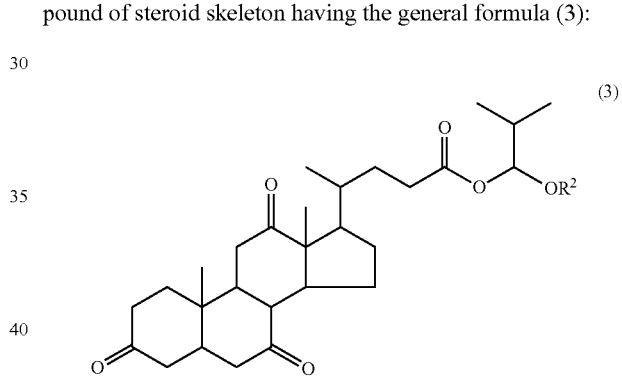

(3)

wherein $R^2$ is a straight, branched or cyclic monovalent hydrocarbon group which may contain an oxygen atom and in which the sum of carbon and oxygen atoms is 1 to 15. The acid-decomposable keto ester compound of steroid skeleton having formula (3) is extraordinarily effective for improving the resolution and LER of a resist pattern obtained from development when added to a resist composition and forming a pattern profile with a high precision when the pattern forming process of the invention is applied.

In formula (3), $R^2$ is a straight, branched or cyclic monovalent hydrocarbon group which may contain an oxygen atom and in which the sum of carbon and oxygen atoms is 1 to 15. Herein oxygen may intervene in an alkylene chain or oxygen may be contained in the form of carbonyl group. Examples of $R^2$ include, but are not limited to, methyl, ethyl, propyl, isopropyl, butyl, isobutyl, s-butyl, t-butyl, pentyl, neopentyl, cyclopentyl, hexyl, cyclohexyl, 2-ethylhexyl, decyl, pentadecyl, adamantyl, norbornyl, norbornylmethyl, tricyclodecanyl, tetracyclododecanyl, tetracyclododecanylmethyl, benzyl, and tetrahydrofurfuryl.

Examples of the acid-decomposable keto ester compound of steroid skeleton having formula (3) include, but are not limited to, the following compounds.

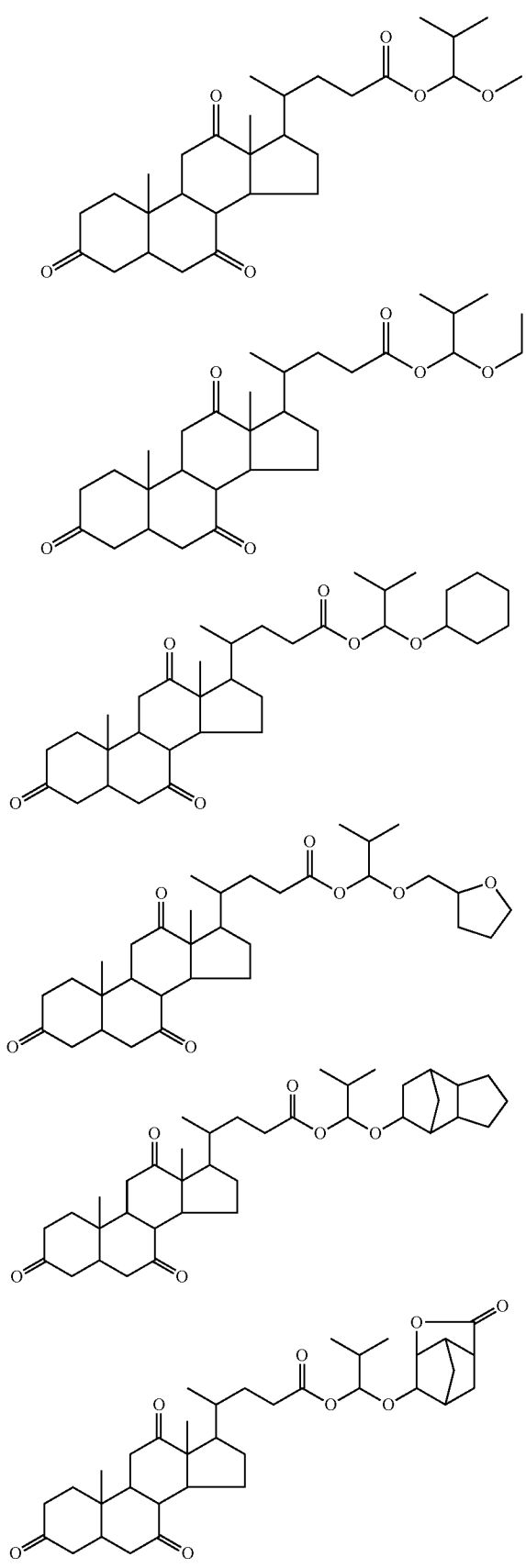

With respect to the acid-decomposable keto ester compound of steroid skeleton having formula (1), (1a) or (3), it is believed that the presence of steroid skeleton contributes to the exertion of inhibitory dissolution and etch resistance. The presence of keto group (carbonyl group) imparts appropriate polarity and hydrophilicity to the molecule and provides affinity to and compatibility with the base resin, thus contributing to LER improvement. In addition, the keto group has an appropriate affinity to the acid generated by the acid generator and is believed to be effective for controlling acid diffusion. If the keto group is absent, and a methylene group or ester group is present instead, acid diffusion control becomes insufficient, often leading to a likelihood of degrading resolution as the feature size is reduced. If a hydroxyl group is present instead of the keto group, it may lead to excessive hydrophilicity, less inhibitory dissolution, a drop of dissolution contrast, and degraded resolution. The presence of acid-decomposable group within the molecule is essential for a dissolution contrast. The acid-decomposable group contributes to resolution improvement in that under the action of the acid generated by the acid generator in the exposed area of resist film, the acid-decomposable group is decomposed to generate a carboxylic acid whereby the compound increases its solubility in alkaline developer. By selecting appropriate ones for $R^1$, $R^2$, Y and n in formula (1), (1a) or (3) from their possible ranges, properties of the acid-decomposable keto ester compound of steroid skeleton having formula (1), (1a) or (3) including dissolution inhibition, dissolution contrast, decomposition reactivity, polarity, hydrophilicity, diffusion rate, solvent solubility, acid affinity, and base resin compatibility can be adjusted in accordance with a particular base resin, acid generator and lithography method used. Eventually the pattern profile and other performance factors of the resist composition can be adjusted optimum.

The acid-decomposable keto ester compound of steroid skeleton having formula (1), (1a) or (3) may be used in different ways, for example, as a molecular resist based on this keto ester compound or as a dissolution inhibitor in combination with a polymer having an acid labile group which turns alkali soluble under the action of acid.

The acid-decomposable keto ester compound of steroid skeleton having formula (3) can be prepared by selecting an optimum method in accordance with the structure of the compound. Suitable methods include, but are not limited to, O-alkylation reaction of dehydrocholic acid using a halide and addition reaction of dehydrocholic acid to a vinyl ether compound. These methods are described below in detail.

The first method, O-alkylation reaction of dehydrocholic acid using a halide runs according to the following scheme.

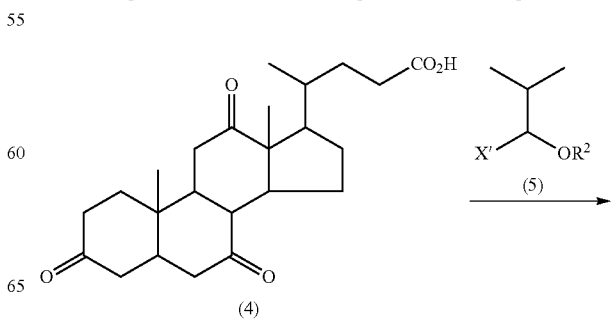

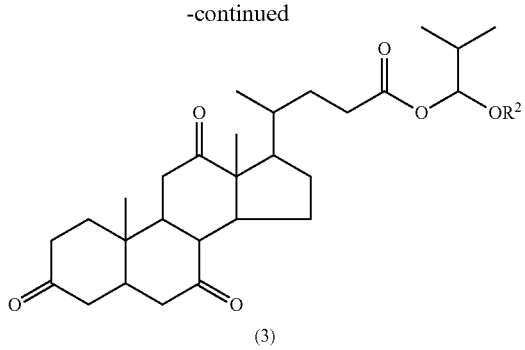

(3)

Herein R² is as defined above, and X' is halogen.

The halide (5) serves as the O-alkylating agent in the present reaction, wherein X' is halogen, with chlorine being most preferable from the industrial standpoint of shelf stability of the halide (5). The halide (5) is desirably used in an amount of 0.5 to 5 moles, more desirably 0.9 to 2 moles per mole of dehydrocholic acid (4). Reaction is desirably carried out in a solvent. Suitable reaction solvents include hydrocarbons such as hexane, heptane, benzene, toluene, and xylene; ethers such as diethyl ether, dibutyl ether, tetrahydrofuran, 1,4-dioxane, and diglyme; chlorinated solvents such as methylene chloride, chloroform and 1,2-dichloroethylene; aprotic polar solvents such as N,N-dimethylformamide, N,N-dimethylacetamide, dimethyl sulfoxide, and N-methylpyrrolidone; esters such as ethyl acetate and butyl acetate; ketones such as acetone and 2-butanone; nitriles such as acetonitrile; amines such as pyridine and triethylamine; alcohols such as isopropyl alcohol and t-butyl alcohol; and water. A suitable solvent or solvents may be selected and used alone or in admixture, depending on reaction conditions. The reaction temperature may be selected in the range from 0° C. to the reflux temperature of the solvent, depending on the desired reaction rate. If desired, a base may be added to the reaction system. Examples of the base include amines such as pyridine, triethylamine, diisopropylethylamine, 4-dimethylaminopyridine, and imidazole; metal alkoxides such as sodium methoxide, sodium ethoxide, and potassium t-butoxide; carbonates such as sodium carbonate, potassium carbonate, and cesium carbonate; hydroxides such as sodium hydroxide, potassium hydroxide, and tetramethylammonium hydroxide; metal hydrides such as sodium hydride and potassium hydride; organometallics such as butyl lithium and ethyl magnesium bromide; and metal amides such as lithium diisopropyl amide. A suitable base or bases may be selected and used alone or in admixture, depending on reaction conditions. The base is desirably used in an amount of 0.1 to 10 moles, more desirably 0.9 to 5 moles per mole of dehydrocholic acid (4).

If desired for accelerating the reaction rate, a catalyst may be added to the reaction system. Suitable catalysts include iodides such as sodium iodide, lithium iodide, and tetrabutylammonium iodide, and bromides such as sodium bromide, lithium bromide, and tetrabutylammonium bromide. When added, the catalyst is desirably used in an amount of 0.001 to 2 moles, more desirably 0.005 to 0.5 mole per mole of dehydrocholic acid (4). The reaction time is determined as appropriate by monitoring the reaction process by liquid chromatography (LC) or thin-layer chromatography (TLC) because it is desirable from the yield aspect to drive the reaction to completion. Usually the reaction time is about 0.5 to about 24 hours. The desired compound (3) may be obtained from the reaction mixture by ordinary aqueous work-up. If necessary, the compound may be purified by standard techniques like chromatography and recrystallization. Alternatively, the aqueous work-up is omitted, and the reaction solution may be purified directly or after filtration of the salt resulting from reaction.

The second method, addition reaction of dehydrocholic acid to a vinyl ether compound runs according to the following scheme.

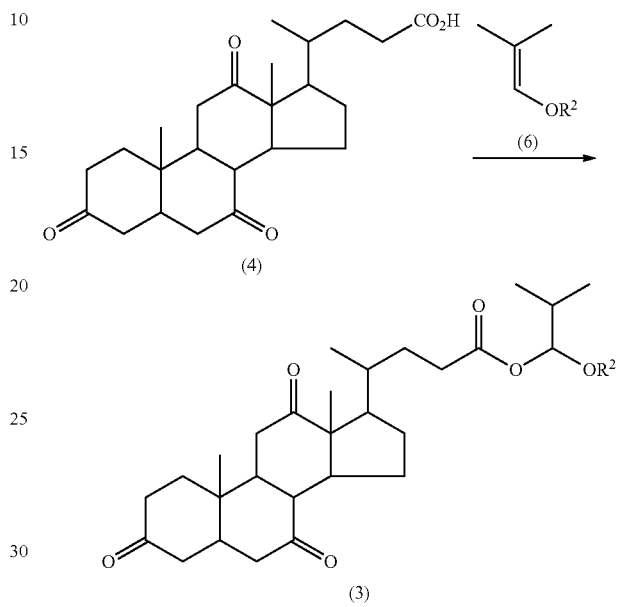

Herein R² is as defined above.

The vinyl ether compound (6) is desirably used in an amount of 0.5 to 10 moles, more desirably 0.9 to 5 moles per mole of dehydrocholic acid (4). Reaction is desirably carried out in a solvent. Suitable reaction solvents include hydrocarbons such as hexane, heptane, benzene, toluene, and xylene; ethers such as diethyl ether, dibutyl ether, tetrahydrofuran, 1,4-dioxane, and diglyme; chlorinated solvents such as methylene chloride, chloroform and 1,2-dichloroethylene; aprotic polar solvents such as N,N-dimethylformamide, N,N-dimethylacetamide, dimethyl sulfoxide, and N-methylpyrrolidone; esters such as ethyl acetate and butyl acetate; ketones such as acetone and 2-butanone; and nitriles such as acetonitrile. A suitable solvent or solvents may be selected and used alone or in admixture, depending on reaction conditions. The reaction temperature may be selected in the range from 0° C. to the reflux temperature of the solvent, depending on the desired reaction rate. If desired, an acid catalyst may be added to the reaction system. Examples of the acid catalyst include mineral acids such as sulfuric acid, hydrochloric acid, phosphoric acid and perchloric acid; Lewis acids such as boron trifluoride, boron trifluoride diethyl ether complex, dibutyltin oxide, aluminum chloride, zinc chloride, tetrachlorotitanium, and tetramethoxytitanium; sulfonic acids such as methanesulfonic acid and p-toluenesulfonic acid; salts such as potassium hydrogen sulfate, calcium chloride, magnesium chloride, and pyridinium p-toluenesulfonate; carboxylic acids such as oxalic acid and trifluoroacetic acid; and acidic resins such as cation exchange resins. A suitable catalyst or catalysts may be selected and used alone or in admixture, depending on reaction conditions. The catalyst is desirably used in an amount of 0.1 to 10 moles, more desirably 0.9 to 5 moles per mole of dehydrocholic acid (4).

The reaction time is determined as appropriate by monitoring the reaction process by liquid chromatography (LC) or thin-layer chromatography (TLC) because it is desirable from the yield aspect to drive the reaction to completion. Usually the reaction time is about 0.5 to about 24 hours. The desired compound (3) may be obtained from the reaction mixture by ordinary aqueous work-up. If necessary, the compound may be purified by standard techniques like chromatography and recrystallization. Alternatively, the reaction solution may be directly purified in some cases, without the aqueous work-up.

In preparing a resist composition, the softening accelerator may be used alone or in admixture of two or more. The amount of the softening accelerator used may be determined as appropriate, depending on the temperature of post-develop heat treatment of resist film as well. In order that a chemically amplified positive resist composition form a pattern with a satisfactory LER through heat treatment at a temperature of not higher than 150° C. which causes no damages to resist components, the softening accelerator is added to the resist composition in an amount of 2.5% to 20% by weight based on the total solids in the resist composition. If the amount of the softening accelerator is below the range, no LER improvement is achievable even by elevating the heating temperature. If the amount is excessive, problems arise that the pattern profile is exacerbated and the control of pattern size by heat treatment is difficult.

In the pattern forming process, a resist composition is used to form a resist film. The resist composition contains the softening accelerator defined above and other components commonly used in well-known resist compositions. Typically it is a chemically amplified positive resist composition comprising (A) a base resin having an acidic functional group protected with an acid labile group, which is substantially alkali insoluble, but turns alkali soluble when the acid labile group is eliminated, (B) an acid generator, (C) a nitrogen-containing compound as a basic component, and (D) an organic solvent.

Polymers used as the base resin (A) include polyhydroxystyrene (PHS), and copolymers of hydroxystyrene with styrenes, (meth)acrylic acid esters or other polymerizable olefinic compounds, for KrF excimer laser resist uses; (meth) acrylic acid ester polymers, alternating copolymers of cycloolefin with maleic anhydride, similar alternating copolymers further containing vinyl ethers or (meth)acrylic acid esters, polynorbornene, and polymers obtained from ring-opening metathesis polymerization (ROMP) of cycloolefins, for ArF excimer laser resist use; and fluorinated forms of the foregoing polymers (for both KrF and ArF laser uses) and polymers resulting from ring-closure polymerization using fluorinated dienes for $F_2$ laser resist use. Silicon-substituted forms of the foregoing polymers and polysilsesquioxane polymers are useful for the bilayer resists. The base polymer is not limited to these polymer systems. Preferably the base polymer has a weight average molecular weight (Mw) of 2,000 to 100,000 as measured by GPC versus polystyrene standards using tetrahydrofuran solvent. With Mw below 2,000, film formation and resolution may become poor. With Mw beyond 100,000, resolution may become poor or foreign matter may generate during pattern formation. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

In the embodiment wherein the chemically amplified positive resist composition is used as the resist material for the ArF excimer laser lithography, the preferred base resins include those resins described in U.S. Pat. No. 7,537,880 (JP-A 2008-111103, paragraphs [0072]-[0121]). Typical recurring units of which the base polymer is composed include recurring units of the following formula (R1) for the ArF lithography polymers and recurring units of the following formula (R2) for the KrF, EB and EUV lithography polymers.

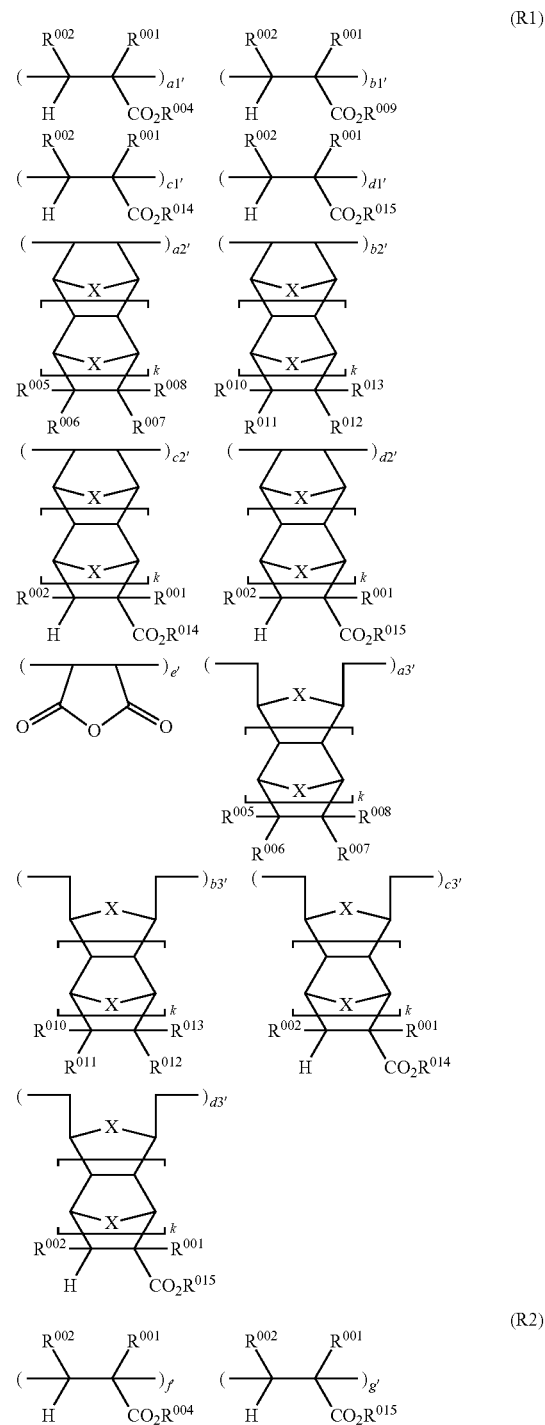

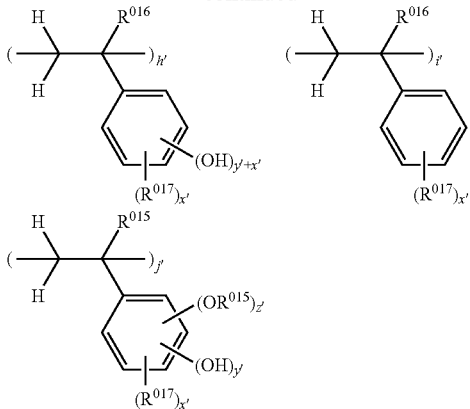

Herein, $R^{001}$ is hydrogen, methyl or $CH_2CO_2R^{003}$.

$R^{002}$ is hydrogen, methyl or $CO_2R^{003}$.

$R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl. Suitable straight, branched or cyclic $C_1$-$C_{15}$ alkyl groups are as exemplified for $R^{003}$.

Two of $R^{005}$ to $R^{008}$ (for example, a pair of $R^{005}$ and $R^{006}$, or $R^{006}$ and $R^{007}$) may bond together to form a ring with the carbon atom(s) to which they are attached, and in that event, at least one of $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds or straight, branched or cyclic $C_1$-$C_{15}$ alkylene groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkylene groups are those groups exemplified for $R^{003}$, with one hydrogen atom eliminated therefrom.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ (for example, a pair of $R^{010}$ and $R^{011}$, or $R^{011}$ and $R^{012}$) may bond together to form a ring with the carbon atom(s) to which they are attached, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic $C_2$-$C_{15}$ alkylene groups. Illustrative examples of suitable divalent $C_2$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkylene groups are those groups exemplified for $R^{003}$, with one hydrogen atom eliminated therefrom.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group, examples of which will be described later.

$R^{016}$ is hydrogen or methyl.

$R^{017}$ is a straight, branched or cyclic $C_1$-$C_8$ alkyl group.

X is $CH_2$ or an oxygen atom. Letter k is 0 or 1.

In formula (R1), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), letters f', g', h', i', and j' are numbers from 0 to less than 1, satisfying f'+g'+h'+i'+j'=1; x', y' and z' are each an integer of 0 to 3, satisfying 1≤x'+y'+z'≤5 and 1≤y'+z'≤3.

The acid labile group represented by $R^{015}$ may be selected from a variety of such groups, for example, groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

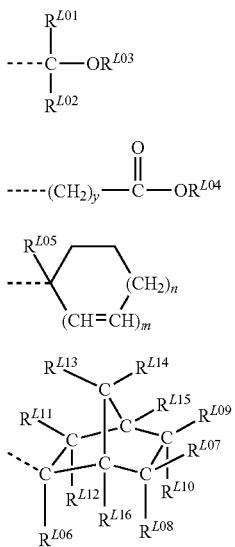

(L1)

(L2)

(L3)

(L4)

In these formulae, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$, and suitable substituted alkyl groups are shown below.

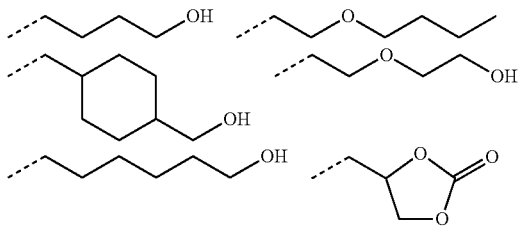

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of participant $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups include trimethylsilyl, triethylsilyl and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups, and similar groups in which one or more methylene moiety is replaced by oxygen or sulfur atom. Examples of the optionally substituted aryl groups include phenyl, methylphenyl, naphthyl, anthryl, phenanthryl, and pyrenyl. Letter m is equal to 0 or 1, n is equal to 0, 1, 2 or 3, and 2 m+n is equal to 2 or 3.

In formula (L4), $R^{L06}$ is a substituted or unsubstituted, straight, branched or cyclic $C_1$-$C_{10}$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$, taken together, form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

The resist composition for use in the EUV lithography or in forming a photomask pattern should preferably have high etch resistance even in thin film form. Preferred in this context are polymers comprising units of hydroxystyrene derivatives, units of hydroxystyrene derivatives in which benzene ring is replaced by naphthalene or anthracene ring, units of (meth)acrylic acid hydroquinone ester derivatives, and units of hydroquinone ester derivatives in which benzene ring is replaced by naphthalene or anthracene ring. Incorporating units of indene or acenaphthylene derivatives may impart higher etch resistance. Several preferred structures for the foregoing units are illustrated below.

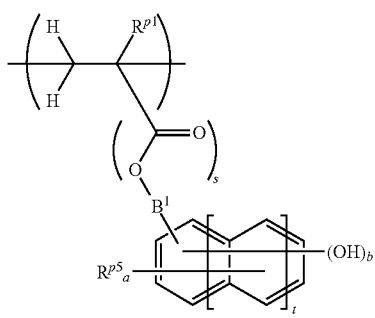

Herein $R^{p1}$ is hydrogen or methyl, s is each independently 0 or 1, t is each independently an integer of 0 to 2, $R^{p5}$ is each independently $C_1$-$C_6$ alkyl, $B^1$ is a single bond or a $C_1$-$C_{10}$ alkylene group which may contain an ether bond at an intermediate of the chain, a is an integer of 0 to 3, and b is an integer of 1 to 3.

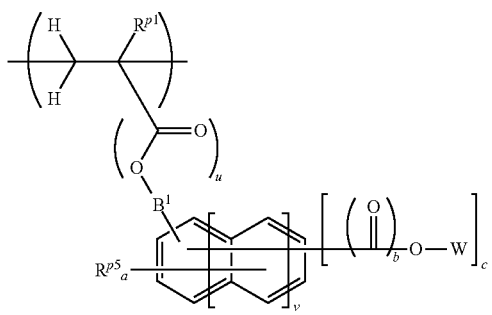

Herein $R^{p1}$ and $R^{p5}$ are as defined above, u is 0 or 1, v is an integer of 0 to 2, $B^2$ is a single bond or a $C_1$-$C_{10}$ alkylene group which may contain an ether bond at an intermediate of the chain, a is an integer of 0 to 3, b is 0 or 1, and c is an integer of 1 to 3. When c is 1, W is an acid labile group. When c is 2 or 3, W is hydrogen or an acid labile group, with at least one W being an acid labile group.

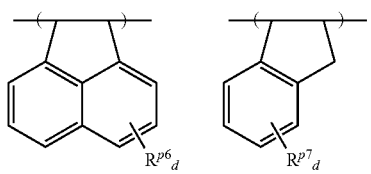

Herein d is an integer of 0 to 4, $R^{p6}$ and $R^{p7}$ are each independently an optionally halo-substituted, $C_1$-$C_6$ alkyl or primary or secondary alkoxy group, an optionally halo-substituted, $C_2$-$C_7$ alkylcarbonyloxy group, a hydroxyl group, or an acid labile group-protected hydroxyl group.

Of the aromatic ring-bearing recurring units illustrated above, those recurring units having a phenolic hydroxyl group are preferably incorporated in an amount of 35 to 90 mol % of the entire recurring units of a polymer. Less than 35 mol % of these units may lead to a shortage of substrate adhesion whereas more than 90 mol % may lead to an excessive thickness loss of resist film in the unexposed region after development. Those recurring units having an acid labile group-protected phenolic hydroxyl group or acid labile group-protected carboxyl group are preferably incorporated in an amount of 5 to 50 mol % of the entire recurring units. Less than 5 mol % of these units may lead to a loss of dissolution contrast whereas more than 50 mol % may detract from substrate adhesion. Those recurring units having neither an acidic group nor a protected acidic group are preferably incorporated in an amount of 0 to 35 mol % of the entire recurring units. More than 35 mol % of these units may detract from substrate adhesion. Besides the foregoing four recurring units, the polymer may contain recurring units derived from aromatic ring-free (meth)acrylic acid derivatives, for example, aromatic ring-free recurring units as included in (R2), preferably in an amount of up to 30 mol % of the entire recurring units. More than 30 mol % of these units may fail to provide etch resistance.

The acid labile groups to be introduced into the base polymers may be selected from a variety of such groups, preferably from acetal groups of 2 to 30 carbon atoms and tertiary alkyl groups of 4 to 30 carbon atoms having the formulae (C1) and (C2), respectively.

$$\begin{array}{c} R^{11} \\ | \\ -C-O-R^{13} \\ | \\ R^{12} \end{array} \quad (C1)$$

$$\begin{array}{c} R^{14} \\ | \\ -C-R^{15} \\ | \\ R^{16} \end{array} \quad (C2)$$

In formulae (C1) and (C2), $R^{11}$ and $R^{12}$ each are hydrogen or a straight, branched or cyclic alkyl group of 1 to 20 carbon atoms, preferably 1 to 12 carbon atoms, which may contain a heteroatom such as oxygen, sulfur, nitrogen or fluorine, $R^{13}$, $R^{14}$, $R^{15}$ and $R^{16}$ each are a straight, branched or cyclic alkyl group, aryl group or aralkyl group of 1 to 20 carbon atoms, preferably 1 to 12 carbon atoms, which may contain a heteroatom such as oxygen, sulfur, nitrogen or fluorine. A pair of $R^{11}$ and $R^{12}$, a pair of $R^{11}$ and $R^{13}$, a pair of $R^{12}$ and $R^{13}$, a pair of $R^{14}$ and $R^{15}$, a pair of $R^{14}$ and $R^{16}$, or a pair of $R^{15}$ and $R^{16}$, taken together, may form a non-aromatic ring of 3 to 20 carbon atoms, preferably 3 to 12 carbon atoms, with the carbon or oxygen atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, neopentyloxymethyl, (1-methylcyclohexyl)methoxymethyl, 2-adamantyloxymethyl, (1-adamantyl)methoxymethyl, phenethyloxymethyl, (2-methyl-2-norbornyl)methoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo [5.2.1.0$^{2,6}$]decyl, 3-methyl-3-tetracyclo[4.4.0.1$^{2,5}$.1$^{7,10}$] dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydroxyl groups may be linked via acid labile groups of the following general formula (C3a) or (C3b) for crosslinkage between molecules or within a molecule.

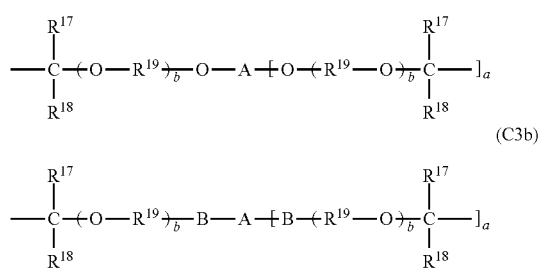

Herein, $R^{17}$ and $R^{18}$ each are hydrogen or a straight, branched or cyclic $C_1$-$C_8$ alkyl group, or $R^{17}$ and $R^{18}$, taken together, may form a ring with the carbon atom to which they are attached. Each of $R^{17}$ and $R^{18}$ is a straight or branched $C_1$-$C_8$ alkylene group when they form a ring. $R^{19}$ is a straight, branched or cyclic $C_1$-$C_{10}$ alkylene group. Letter "a" is an integer of 1 to 7, and "b" is 0 or an integer of 1 to 10. "A" is a (a+1)-valent aliphatic or alicyclic saturated hydrocarbon group, aromatic hydrocarbon group or heterocyclic group of 1 to 50 carbon atoms, which may have an intervening heteroatom and in which some hydrogen atoms may be replaced by hydroxyl, carboxyl or carbonyl radicals or fluorine atoms. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto.

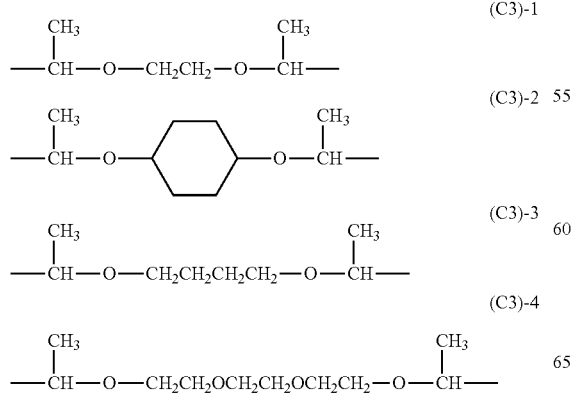

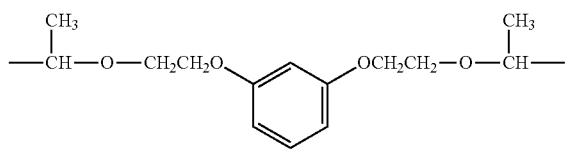

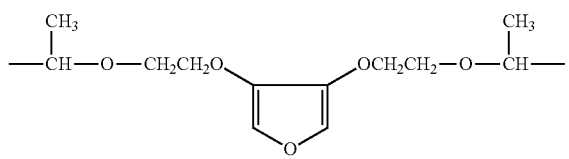

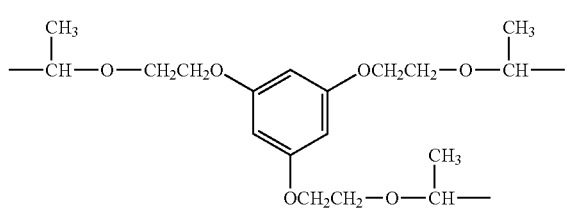

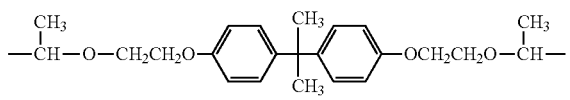

An acid generator (B) is added to the resist composition which is used to form a resist film in the pattern forming process of the invention. Numerous acid generators are known in the art, for example, in Patent Documents 1 to 6, to be used in chemically amplified resist compositions. Generally, any of well-known compounds may be used herein. Sulfonium acid generators are preferred for the EB lithography and EUV lithography, and a number of such compounds are well known. In an alternative embodiment, the sulfonium acid generator may be provided as a polymer comprising recurring units having the sulfonium acid generator incorporated in the side chain thereof as disclosed in Patent Document 7. Preferred examples of the acid generator are illustrated below, but not limited thereto.

Below illustrated are preferred examples of the acid generator which is not incorporated in recurring units as part of a polymer.

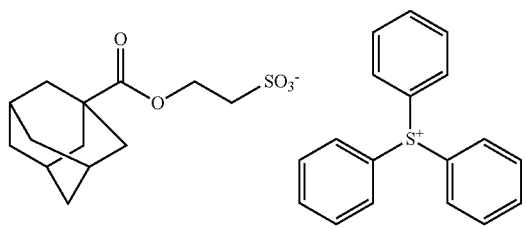

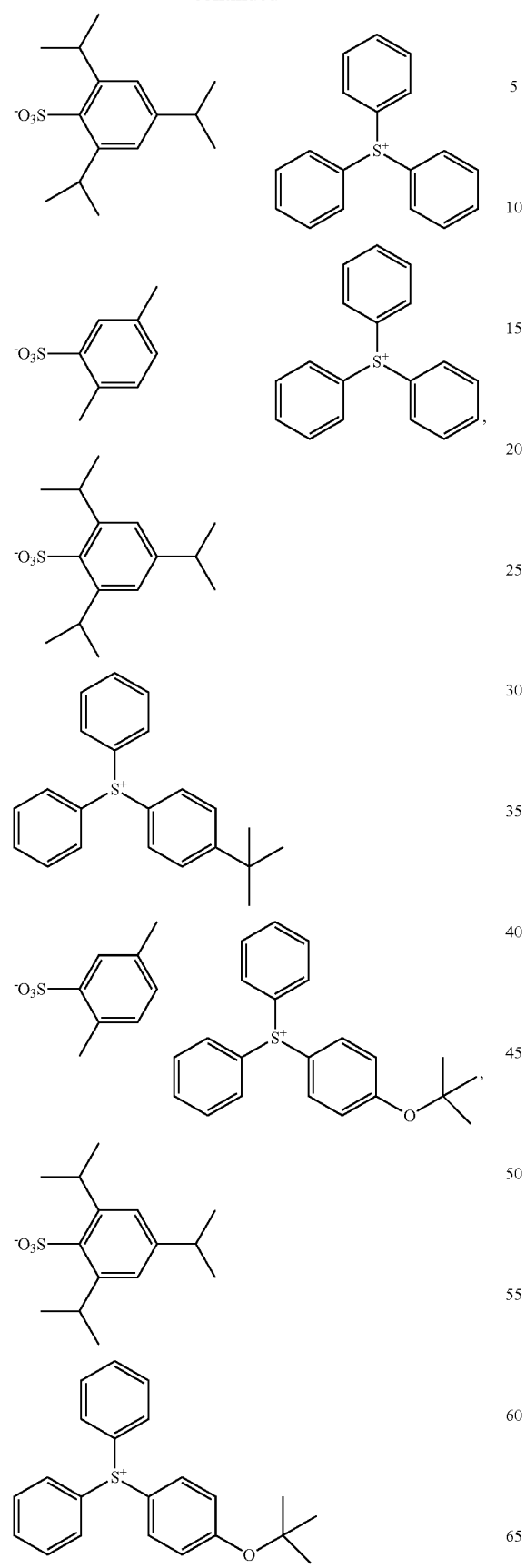
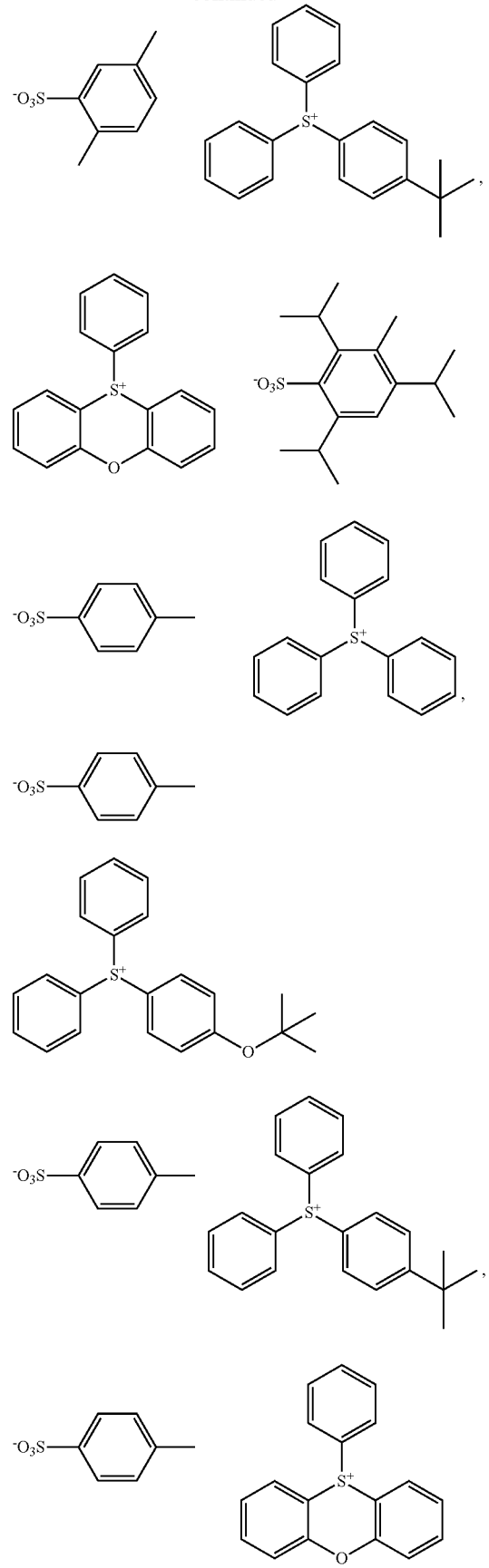

-continued
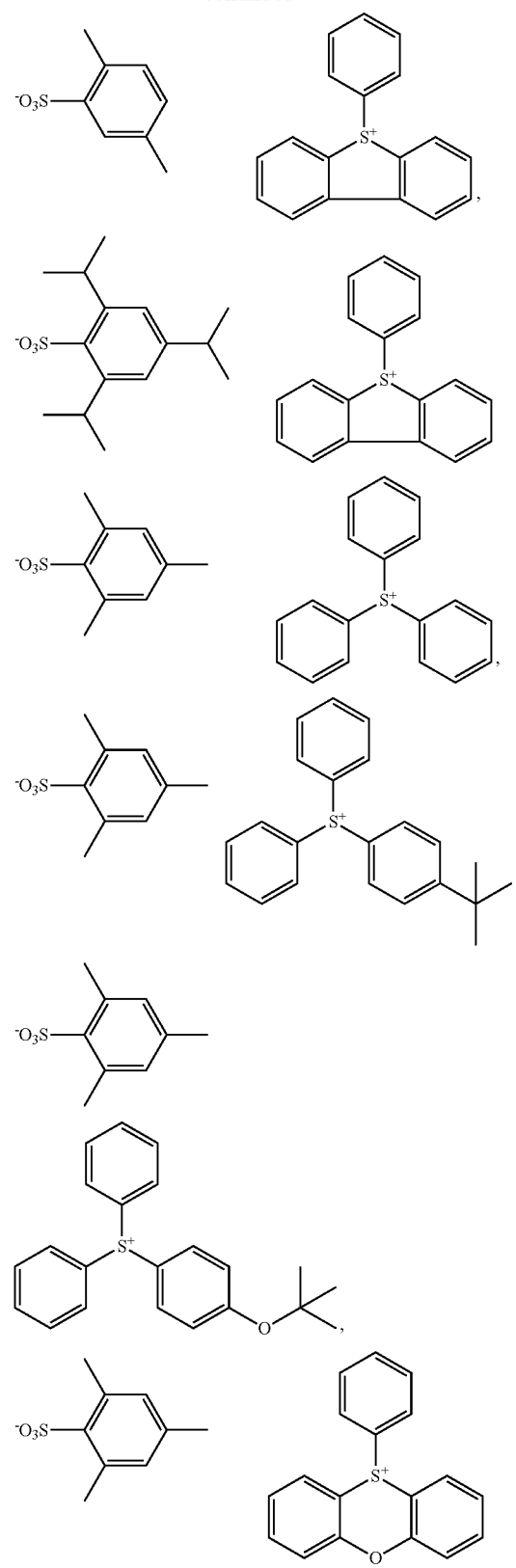
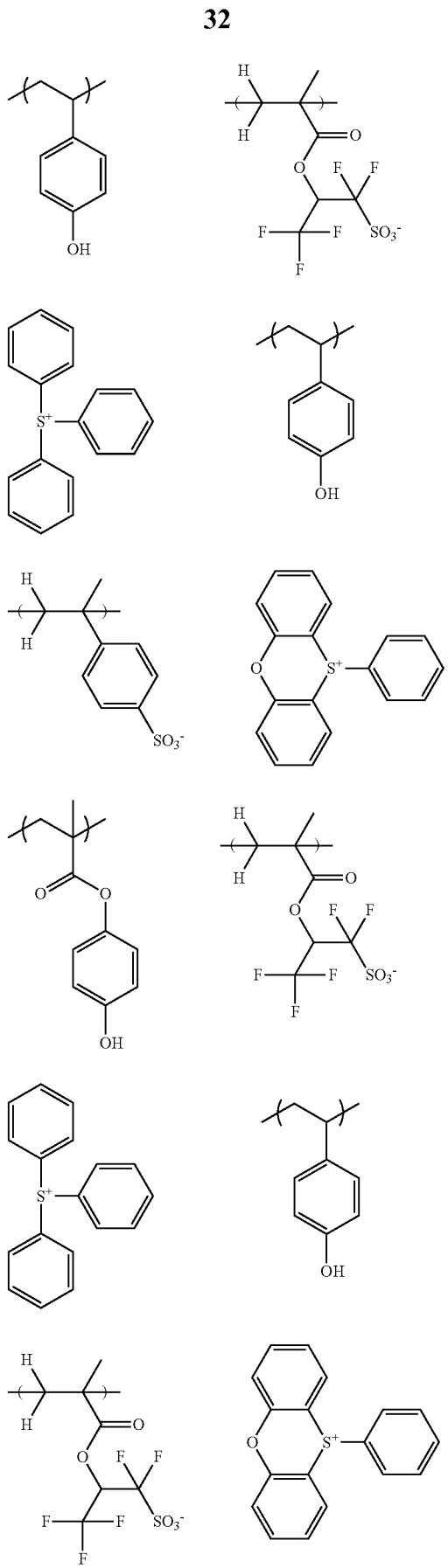
Below illustrated are preferred examples of the acid generator which is incorporated in recurring units as part of a polymer.

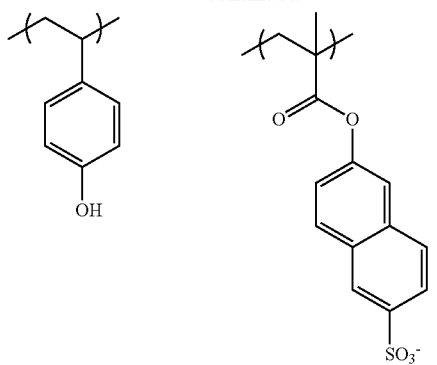
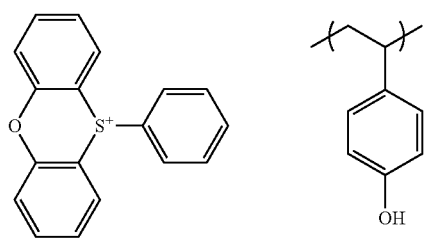
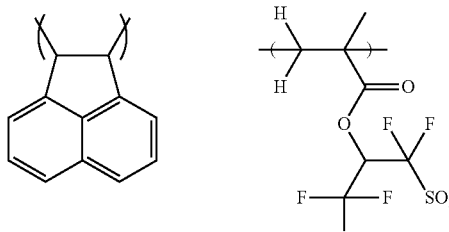
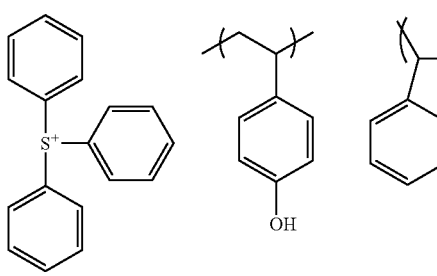
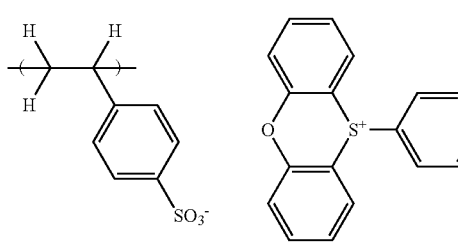
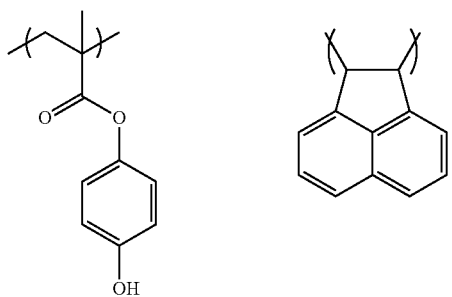
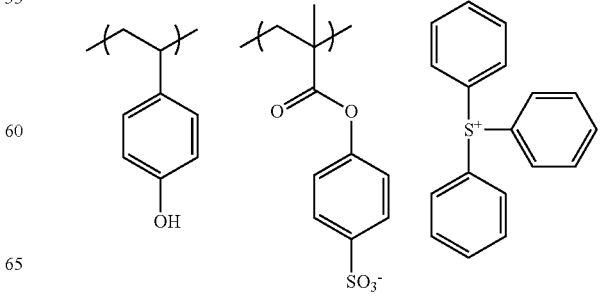

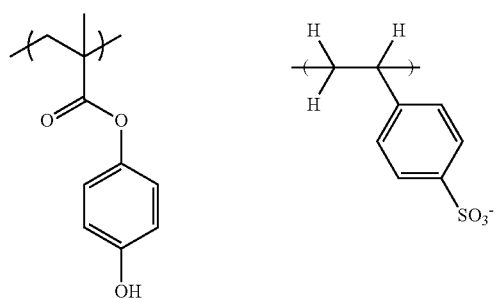
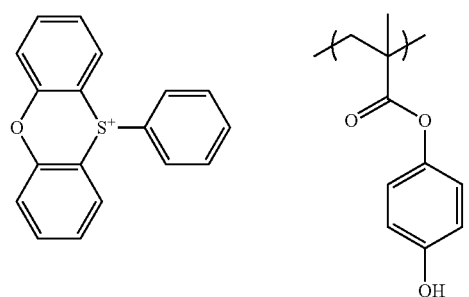
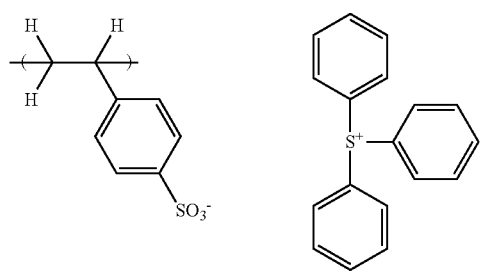
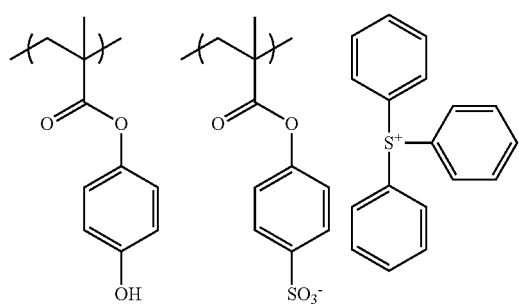
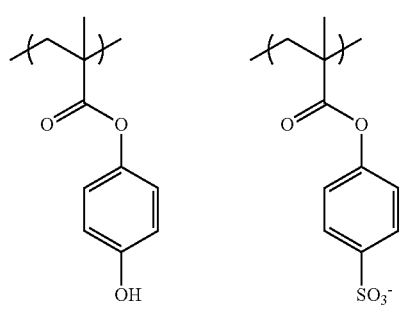
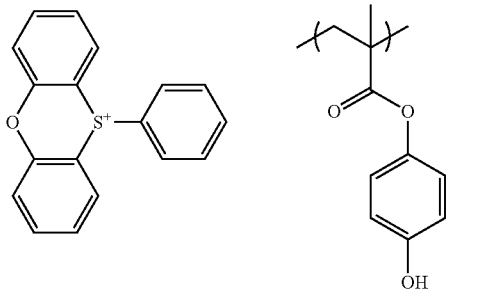
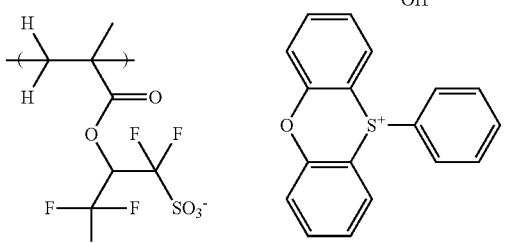
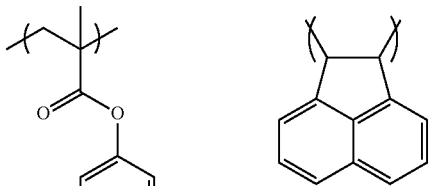
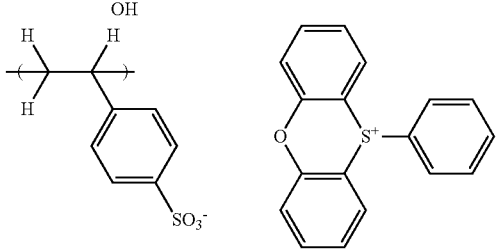
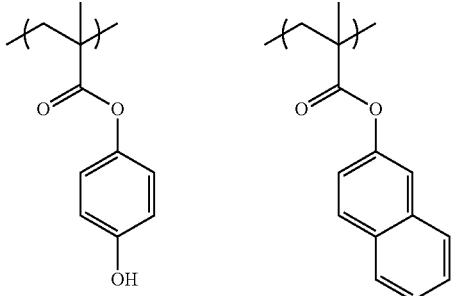
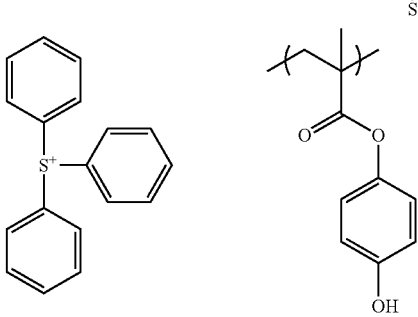

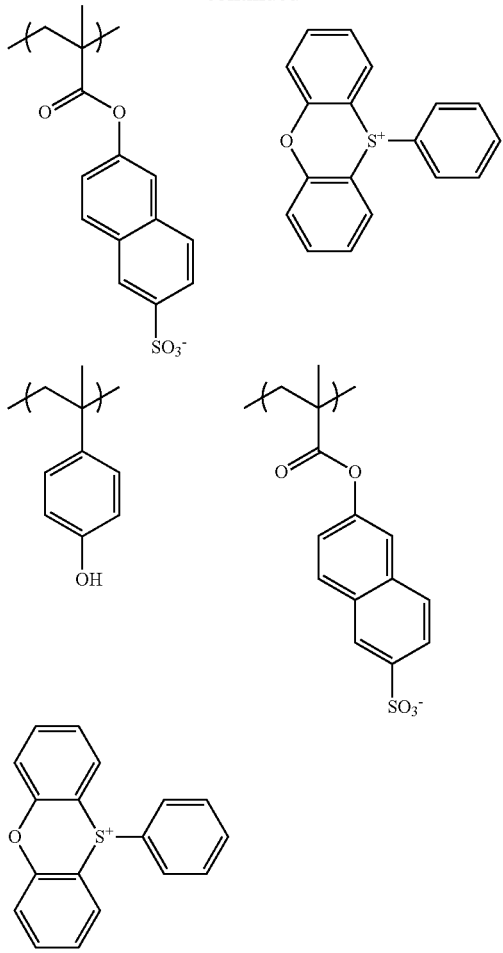

In the resist composition, the (photo) acid generator may be added in any desired amount as long as the objects of the invention are not compromised. An appropriate amount of the (photo) acid generator is 0.1 to 80 parts, and more preferably 1 to 40 parts by weight per 100 parts by weight of the base resin in the composition. Too high a proportion of the (photo) acid generator may give rise to problems of degraded resolution and foreign matter upon development and resist film peeling. The (photo) acid generator may be used alone or in admixture of two or more. The transmittance of the resist film can be controlled by using an (photo) acid generator having a low transmittance at the exposure wavelength and adjusting the amount thereof.

A nitrogen-containing compound is used in the resist composition as basic component or quencher (C). The nitrogen-containing compound may be added alone or in admixture of two or more and is capable of suppressing the rate of diffusion when the acid generated by the acid generator diffuses within the resist film. The inclusion of the compound facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable basic component or quencher include primary, secondary, and tertiary aliphatic amines, aromatic amines, heterocyclic amines, nitrogen-containing compounds with carboxyl group, nitrogen-containing compounds with hydroxyl group, N-oxides, amides, imides, carbamates, and ammonium salts.

A number of nitrogen-containing compounds are already known as the basic component. Numerous examples are illustrated, for example, in Patent Document 5. Any suitable compound may be selected from many known nitrogen-containing compounds depending on a particular substrate, processing conditions, and properties available from a combination with other resist components.

Examples of the nitrogen-containing compound used in the resist composition are given below, but not limited thereto. Suitable primary aliphatic amines include cetylamine and tetraethylenepentamine. Suitable secondary aliphatic amines include didecylamine and didodecylamine. Suitable tertiary aliphatic amines include trioctylamine, tridecylamine, tridodecylamine, and N,N-dicyclohexylmethylamine.

Examples of suitable aromatic and heterocyclic amines include aniline derivatives (e.g., N,N-bis(2-hydroxyethyl)-aniline and 2,6-diisopropylaniline), pyrrole derivatives, oxazole derivatives, thiazole derivatives, imidazole derivatives (e.g., 4-methyl-2-phenylimidazole and 2,4,5-triphenylimidazole), benzimidazole derivatives (e.g., benzimidazole, 2-methylbenzimidazole and 2-phenylbenzimidazole), pyrazole derivatives, furazan derivatives, pyrroline derivatives, pyrrolidine derivatives, imidazoline derivatives, imidazolidine derivatives, pyridine derivatives (e.g., dimethylaminopyridine and 2,6-di-t-butyl-4-methylpyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives, isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid derivatives (e.g., 4-dimethylaminobenzoic acid and 4-dibutylaminobenzoic acid) and amino acid derivatives. Examples of suitable nitrogen-containing compounds having hydroxyl group include triethanolamine, triisopropanolamine, 4-(2-hydroxyethyl)morpholine, and 3-quinuclidinol. Suitable N-oxides include tributylamine-N-oxide, N-methylmorpholine-N-oxide, and tris(2-methoxymethoxyethyl)amine-N-oxide. Suitable amide derivatives include 1-cyclohexylpyrrolidone and N-pivaloyl-2-phenylbenzimidazole. A typical imide derivative is phthalimide. Suitable carbamate derivatives include N-t-butoxycarbonyl-N,N-dicyclohexylamine, N-t-butoxycarbonylbenzimidazole, N-t-butoxycarbonyl-2-phenylbenzimidazole, N-benzyloxycarbonyl-2-phenylbenzimidazole and N-allyloxycarbonyl-2-phenylbenzimidazole.

Examples of suitable ammonium salts include triethylammonium camphorsulfonate, tetrabutylammonium acetate, tetrabutylammonium p-toluenesulfonate, tetrabutylammonium 2,4,6-triisopropylbenzenesulfonate, tetrabutylammonium camphorsulfonate, benzyltrimethylammonium camphorsulfonate, trimethyloctadecylammonium 2,4,6-triisopropylbenzenesulfonate, and 4-(2-cyclohexanecarboxyethyl)morpholinium camphorsulfonate.

Also included are tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)

ethyl}amine, tris(2-acetoxyethyl)amine, tris(2-propionyloxyethyl)amine, tris(2-benzoyloxyethyl)amine, N,N-bis(2-acetoxyethyl)-2-(methoxycarbonyl)ethylamine, N,N-bis(2-methoxyethyl)-2-(methoxycarbonyl)ethylamine, 1-[2-(methoxymethoxy)ethyl]-2-phenylbenzimidazole, 1-dodecylpiperidine, 1-[2-[(2-methoxyethoxy)methoxy]ethyl]pyrrolidine, 4-dodecylmorpholine, 1-[2-[(2-methoxyethoxy)methoxy]ethyl]piperidine, 4-[2-[(2-methoxyethoxy)methoxy]ethyl]morpholine, 4-[2-[2-(2-methoxyethoxy)ethoxy]ethyl]morpholine, 1-[2-[2-(2-methoxyethoxy)ethoxy]ethyl]benzimidazole, 4-[2-[2-[2-(2-methoxyethoxy)ethoxy]ethoxy]ethyl]morpholine, 2-(1-pyrrolidinyl)ethyl acetate, 2-piperidinoethyl acetate, 2-morpholinoethyl acetate, 2-(1-imidazolyl)ethyl acetate, 2-(1-benzimidazolyl)ethyl acetate, 2-(2-phenyl-1-benzimidazolyl)ethyl acetate, 2-piperidinoethyl 2-(2-methoxyethoxy)acetate, 2-morpholinoethyl 2-(2-methoxyethoxy)acetate, 2-(1-benzimidazolyl)ethyl 2-(2-methoxyethoxy)acetate, 2-(2-phenyl-1-benzimidazolyl)ethyl 2-(2-methoxyethoxy)acetate, 2-(1-pyrrolidinyl)ethyl 2-[2-(2-methoxyethoxy)ethoxy]acetate, 2-piperidinoethyl 2-[2-(2-methoxyethoxy)ethoxy]acetate, 2-morpholinoethyl 2-[2-(2-methoxyethoxy)ethoxy]acetate, 2-(1-benzimidazolyl)ethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-acetyl)cholate, 2-morpholinoethyl tris(O-formyl)cholate, 2-morpholinoethyl dehydrocholate, 2-morpholinoethyl cyclopentanecarboxylate, 2-morpholinoethyl cyclohexanecarboxylate, 2-morpholinoethyl 2-naphthalenecarboxylate, and 2-morpholinoethyl 7-oxanorbornane-2-carboxylate.

An appropriate amount of the nitrogen-containing compound is 0.01 to 20 parts, and more preferably 0.1 to 10 parts by weight per 100 parts by weight of the base resin. Less than 0.01 part of the nitrogen-containing compound may be ineffective whereas more than 20 parts may adversely affect sensitivity.

The organic solvent (D) used herein may be any organic solvent in which the softening accelerator, base resin, acid generator, and other components are soluble. Illustrative, non-limiting, examples of the organic solvent include ketones such as cyclopentanone, cyclohexanone, 4-methyl-2-pentanone, and methyl amyl ketone; alcohols such as 3-methoxybutanol, 3-methyl-3-methoxybutanol, 1-methoxy-2-propanol, 1-ethoxy-2-propanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-t-amyl ether, and di-n-hexyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and carbonates such as ethylene carbonate and propylene carbonate. These solvents may be used alone or in combinations of two or more. Of the above organic solvents, it is recommended to use propylene glycol monomethyl ether, PGMEA, cyclohexanone, γ-butyrolactone, ethyl lactate, and mixtures thereof because the base resin and acid generator are most soluble therein.

An appropriate amount of the organic solvent used may be determined in accordance with the desired film thickness or the like and is preferably 200 to 15,000 parts, more preferably 400 to 8,000 parts by weight per 100 parts by weight of the base resin.

Optionally, a surfactant may be added to the resist composition. The surfactant used herein is not particularly limited, and may be selected from a wide range of well-known compounds. Reference may be made to US 20090274978 (JP-A 2009-269953, paragraphs [0142]-[0149]). The surfactants which can be added to resist compositions are generally divided into two groups: surfactants (F1) which are commonly used for facilitating coating operation and surfactants (F2) which are added in the immersion lithography using water in the absence of a resist protective film.

Preferred examples of surfactant (F1) include FC-4430 (3M-Sumitomo Co., Ltd.), and Surflon S-381, Surfynol E1004, KH-20 and KH-30 (all available from AGC Seimi Chemical Co., Ltd.), and partially fluorinated oxetane ring-opening polymerization polymers. These surfactants may be used alone or in admixture. The surfactant (F1) is preferably added in an amount of up to 2 parts, more preferably up to 1 part by weight per 100 parts by weight of the base resin.

When formulated in resist material, the surfactant (F2) segregates at the surface of a resist film as spin coated and functions to prevent or mitigate penetration of water into the resist film and leaching of resist components from the resist film during exposure under water immersion conditions. A surfactant (F2) may be selected from a variety of well-known compounds as long as they have the desired function. They are typically polymeric surfactants which do not dissolve in water, but in alkaline developer and exhibit high water repellency and improved water slip. When added to the resist composition, surfactant (F2) is preferably used in an amount of 0.001 to 20 parts, more preferably 0.01 to 10 parts by weight per 100 parts by weight of the base resin.

According to the pattern forming process of the invention, a resist film is first formed on a processable substrate by coating the resist composition onto the substrate and prebaking the coating. The coating and prebaking steps may be carried out by any well-known techniques. The thickness of the resist film may vary in the range of 10 to 2,000 nm depending on the intended application. Although a resist film having a thickness of not more than 150 nm, especially not more than 100 nm is generally difficult to form a pattern with reduced LER, the pattern forming process of the invention is advantageously applicable in this situation.

For the coating step, spin coating and several other techniques are known. When it is desired to form a resist film having a thickness of about 150 nm or less, spin coating is most preferred for a uniform film thickness.

In one embodiment wherein the processable substrate is a semiconductor wafer, spin coating conditions must be adjusted depending on the size of a wafer, the desired film thickness, the composition of resist, and the like. In an example where a resist film having a thickness of about 100 nm is formed on a 8-inch wafer, a resist film with high uniformity may be obtained by casting the resist composition on the wafer and spinning the wafer at 4,000 to 5,000 rpm for 40 seconds. The resist composition used herein may be prepared using 1,400 to 3,000 parts by weight of the solvent relative to 100 parts by weight of the base resin.

In another embodiment wherein the processable substrate is a photomask blank, spin coating conditions must also be adjusted depending on the size of a blank, the desired film thickness, the composition of resist, and the like. In an example where a resist film having a thickness of about 100 nm is formed on a square blank of 15.2 cm by 15.2 cm, a resist film with high uniformity may be obtained by casting the resist composition on the blank, and spinning the blank at 1,500 to 3,000 rpm for 2 seconds and then at 800 rpm or less for 30 seconds. The resist composition used herein may be prepared using 2,000 to 4,500 parts by weight of the solvent relative to 100 parts by weight of the base resin.

The resist coating is then prebaked in order to remove an excess of the solvent remaining in the coating. In the one embodiment wherein the processable substrate is a semiconductor wafer, prebaking may be carried out on a hot plate at 80 to 130° C. for 1 to 10 minutes, preferably at 90 to 110° C. for 3 to 5 minutes. In the other embodiment wherein the processable substrate is a photomask blank, prebaking may be carried out on a hot plate at 80 to 130° C. for 4 to 20 minutes, preferably at 90 to 110° C. for 8 to 12 minutes until an excess of the solvent remaining in the coating is removed.

Next, the resist film is exposed imagewise for forming the desired pattern. In the case of semiconductor processing, the exposure step includes placing a mask having the desired pattern above the resist film and irradiating high-energy radiation such as deep-UV, excimer laser or x-ray, or EB in a dose of 1 to 100 $\mu C/cm^2$, preferably 10 to 100 $\mu C/cm^2$. Light exposure may be done by a conventional exposure process or in some cases, by an immersion lithography process of providing a liquid fill between the projection lens and the resist film. In the case of photomask blank processing, unlike the fabrication of a multiplicity of identical items, pattern exposure is typically carried out by beam irradiation. The high-energy radiation used herein is generally EB although a beam of other radiation as mentioned above may be equally applicable.

The exposure step is typically followed by post-exposure baking (PEB) for causing the acid to diffuse to perform chemical amplification reaction. In the one embodiment wherein the processable substrate is a semiconductor wafer, PEB may be carried out on a hot plate at 60 to 150° C. for 0.1 to 5 minutes, preferably at 80 to 140° C. for 0.5 to 3 minutes. In the other embodiment wherein the processable substrate is a photomask blank, PEB may be carried out on a hot plate at 60 to 150° C. for 4 to 20 minutes, preferably at 80 to 140° C. for 8 to 12 minutes.

Then development is carried out with a developer which is typically an aqueous alkaline solution, such as a 0.1 to 5 wt %, and preferably 2 to 3 wt % aqueous solution of tetramethylammonium hydroxide (TMAH), this being done by a conventional method such as dip, puddle, or spray technique for a period of 0.1 to 3 minutes, and preferably 0.5 to 2 minutes. In this way, the desired resist pattern is formed on the substrate.

Following development, heat treatment is carried out for provoking thermal deformation to the polymer for improving line edge roughness (LER). The heat treatment is at such a temperature that the line width in the minimum line width region of the resist pattern may not undergo a change of at least 10%, preferably at least 5%. Since thermal deformation is limited to such an extent that the pattern line width may not undergo a change of at least 10%, LER can be improved without a thickness loss of the resist film and noticeable degradation of the pattern profile. When thermal deformation is such that the pattern line width may not undergo a change of at least 5%, LER can be improved without substantial degradation of the pattern profile.

The thermal deformation temperature is typically above the PEB temperature. If a polymer is heated at its heat deflection temperature, excessive mass transfer, especially acid diffusion takes place in the resist film, and as a result, the pattern profile obtained at the time of development is degraded. This inversely implies that optimum prebake and PEB temperatures are determined in the common practice of the resist pattern forming process. The temperature (° C.) for provoking thermal deformation of the polymer after development in the inventive process is in a range which is higher than the optimum PEB temperature (° C.), typically by at least 10 degrees, and which has a span of at least 10 degrees rather than being fixed at a point.

Described below are the conditions under which post-develop heat treatment (PDHT) is carried out according to the resist pattern forming process of the invention. In the one embodiment wherein the processable substrate is a semiconductor wafer, heat treatment may be carried out on a hot plate at 90 to 190° C. for 0.2 to 10 minutes, preferably at 110 to 160° C. for 0.5 to 5 minutes. In the other embodiment wherein the processable substrate is a photomask blank, heat treatment may be carried out at 90 to 190° C. for 0.2 to 20 minutes, preferably at 110 to 160° C. for 0.5 to 15 minutes. It is noted that optimum values of the PDHT conditions vary with the components and composition of the resist material. Thus, an experiment must be carried out before a certain resist composition and/or a processable substrate is first used. Specifically, a model pattern for the target pattern is previously formed on a model substrate for the processable substrate. Heat treatment is carried out at several different temperatures above the PEB temperature, whereupon a line width change and a LER value are measured. LER improvement versus temperature is confirmed.

Of the various types of high-energy radiation that may be used, the process of the invention is best suited to micropattern formation with, in particular, deep-UV having a wavelength of 250 to 120 nm or excimer laser, EUV, x-ray and EB.

EXAMPLE

Examples and Comparative Examples are given below by way of illustration and not by way of limitation. All parts are by weight (pbw). Post-develop heat treatment is often abbreviated as PDHT.

Components of a resist composition used in the pattern forming process are described. The base polymer (Polymer 1) and acid generator (PAG-1, PAG-2) have the structural formulae below.

Polymer 1 consists of hydroxystyrene (A), acenaphthylene (B), and 4-tricyclodecaneoxyisobutoxystyrene (C) in a compositional ratio of 80:10:10 (molar basis) as analyzed by $^1$H-NMR. It has Mw=5,100 and Mw/Mn=1.7 as determined by GPC versus polystyrene standards using tetrahydrofuran solvent.

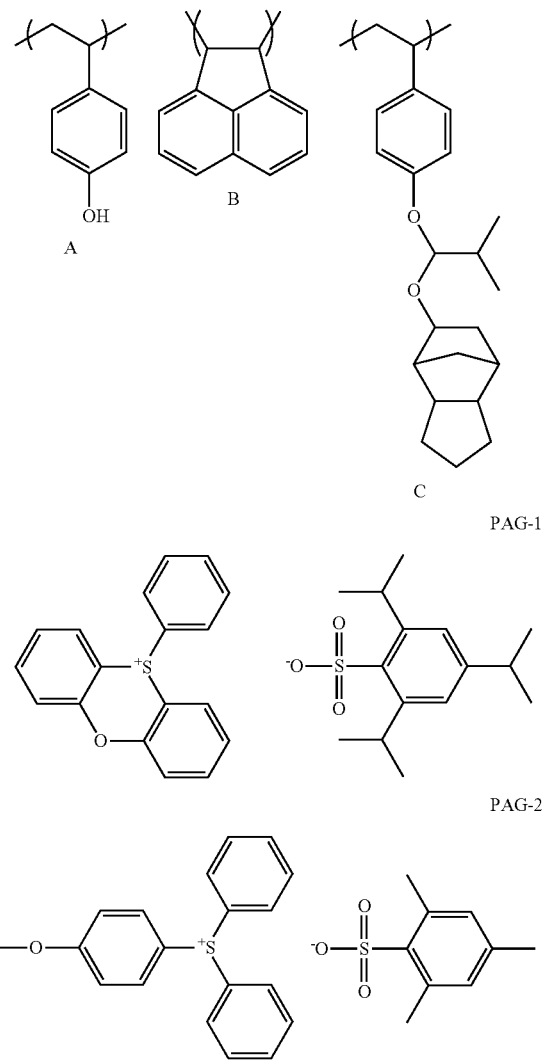

Softening accelerator 1 is identified below.

TABLE 1

| Formulation (pbw) | Example 1 | Comparative Example 1 | Comparative Example 2 | Comparative Example 3 |
|---|---|---|---|---|
| Polymer 1 | 80 | 80 | 80 | 80 |
| PAG-1 | 6 | 6 | 6 | 6 |
| PAG-2 | 2 | 2 | 2 | 2 |
| Softening accelerator 1 | 10 | 10 | — | — |
| Surfactant A | 0.07 | 0.07 | 0.07 | 0.07 |
| N-compound A | 0.3 | 0.3 | 0.3 | 0.3 |
| N-compound B | 0.3 | 0.3 | 0.3 | 0.3 |
| PGMEA | 560 | 560 | 560 | 560 |
| EL | 1,300 | 1,300 | 1,300 | 1,300 |
| PDHT | yes | no | yes | no |

The solvents and nitrogen-containing compounds are identified below.

Solvent A: propylene glycol monomethyl ether acetate (PGMEA)

Solvent B: propylene glycol monomethyl ether (PGME)

Solvent C: ethyl lactate (EL)

N-compound A: tris(2-(methoxymethoxy)ethyl)amine

N-compound B: tris(2-(methoxymethoxy)ethyl)amine oxide

Surfactant A: PF-636 (Omnova Solutions Inc.)

Example 1 & Comparative Examples 1 to 3

A chemically amplified positive resist composition was prepared according to the formulation shown in Table 1. The pattern forming process of the invention was carried out whereupon resolution and pattern profile were evaluated. The bottom row of Table 1 reports whether or not post-develop heat treatment (PDHT) was carried out.

The resist composition thus prepared was filtered through a nylon resin filter with a pore size of 0.04 μm and spin coated onto a mask blank of 152 mm squares having a chromium oxynitride film as the uppermost surface. The spin coating conditions included 1,000 rpm×1 sec, 2,500 rpm×1.5 sec, 800 rpm×5 sec, 100 rpm×30 sec, and 2,000 rpm×30 sec. The coated mask blank was prebaked on a hot plate at 90° C. for 10 minutes to form a resist film of 150 nm thick.

The thickness of the resist film was measured by an optical film thickness measurement system Nanospec (Nanometrics Inc.). Measurement was made at 81 points in the plane of the blank substrate excluding a peripheral band extending 10 mm inward from the blank periphery. An average film thickness and a film thickness range were computed therefrom.

The coated mask blanks were exposed to EB using an EB writer system EBM5000 (NuFlare Technology Inc., accelerating voltage 50 keV), then baked (PEB) at 110° C. for 10 minutes, and developed with a 2.38 wt % tetramethylammonium hydroxide aqueous solution, thereby yielding positive patterns (Example 1 & Comparative Examples 1 to 3). The patterns as developed were further baked at 130° C. for 10 minutes (Example 1 & Comparative Example 2).

The resist patterns thus obtained were evaluated as follow. The optimum exposure dose (sensitivity, Eop) was defined as the dose (μC/cm$^2$) which provided a 1:1 resolution at the top and bottom of a 200-nm 1:1 line-and-space pattern. The maximum resolution of the resist was defined as the minimum line width of a line-and-space pattern that could be resolved and separated at the optimum dose. On observation in cross section of the resist pattern under SEM S-8840 (Hitachi, Ltd.), it was visually judged whether or not the pattern profile was rectangular.

LER was determined by measuring the roughness of a 100-nm line at 50 points along longitudinal 5 μm under SEM and computing a value of 3σ. A smaller value indicates better performance. A change of pattern size by PDHT was determined.

Table 2 tabulates the results of resolution, cross sectional profile, LER, and pattern size change.

TABLE 2

| | Resolution (nm) | Cross-sectional profile | LER (nm) | Pattern size change (nm) |
|---|---|---|---|---|
| Example 1 | 50 | rectangular | 2.5 | 1.5 |
| Comparative Example 1 | 50 | rectangular | 4 | — |
| Comparative Example 2 | 50 | rectangular | 5 | 1.1 |
| Comparative Example 3 | 50 | rectangular | 5 | — |

The data in Table 2 show that Example 1 provides a LER improvement of 1.5 nm over Comparative Example 1 without PDHT. Comparative Examples 2 and 3 free of Softening accelerator 1 provide larger LER values than Comparative Example 1, demonstrating that the softening accelerator is effective for reducing LER. No improvement in LER is achieved when Comparative Example 2 free of Softening accelerator 1 is subjected to PDHT, indicating that Softening accelerator 1 having a low molecular weight is essential for LER improvement.

Examples 2 to 7 & Comparative Examples 4 to 9

Resist compositions (Tables 3 and 4) were prepared as in Example 1 except that Softening accelerators 2 to 7 were used instead of Softening accelerator 1. Softening accelerators 2 to 7 have the following formula.

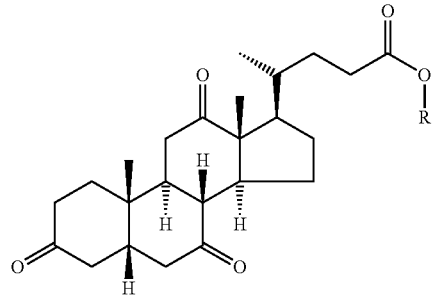

Softening accelerator 2: R=1-adamantyloxymethyl
Softening accelerator 3: R=tert-butyl
Softening accelerator 4: R=1-ethylcyclopentyl
Softening accelerator 5: R=1-ethylcyclooctyl
Softening accelerator 6: R=4-tricyclodecanoxyethyl
Softening accelerator 7: R=4-tricyclodecanoxyisobutyl Pattern formation was the same as in Example 1 including the step of spin coating the resist solution onto a mask blank. Post-develop heat treatment (PDHT) was at 130° C. for 10 minutes. Resolution and pattern profile were evaluated whether or not PDHT was carried out.

The test results of resolution, cross-sectional profile, LER, and pattern size change are shown in Tables 5 and 6.

TABLE 3

| Formulation (pbw) | Example | | | | | |
|---|---|---|---|---|---|---|
| | 2 | 3 | 4 | 5 | 6 | 7 |
| Polymer 1 | 80 | 80 | 80 | 80 | 80 | 80 |
| PAG-1 | 6 | 6 | 6 | 6 | 6 | 6 |
| PAG-2 | 2 | 2 | 2 | 2 | 2 | 2 |
| Softening accelerator 2 | 10 | — | — | — | — | — |
| Softening accelerator 3 | — | 10 | — | — | — | — |
| Softening accelerator 4 | — | — | 10 | — | — | — |
| Softening accelerator 5 | — | — | — | 10 | — | — |
| Softening accelerator 6 | — | — | — | — | 10 | — |
| Softening accelerator 7 | — | — | — | — | — | 10 |
| PGMEA | 560 | 560 | 560 | 560 | 560 | 560 |
| EL | 1,300 | 1,300 | 1,300 | 1,300 | 1,300 | 1,300 |
| Surfactant A | 0.07 | 0.07 | 0.07 | 0.07 | 0.07 | 0.07 |
| N-compound A | 0.3 | 0.3 | 0.3 | 0.3 | 0.3 | 0.3 |
| N-compound B | 0.3 | 0.3 | 0.3 | 0.3 | 0.3 | 0.3 |
| PDHT | yes | yes | yes | yes | yes | yes |

TABLE 4

| Formulation (pbw) | Comparative Example | | | | | |
|---|---|---|---|---|---|---|
| | 4 | 5 | 6 | 7 | 8 | 9 |
| Polymer 1 | 80 | 80 | 80 | 80 | 80 | 80 |
| PAG-1 | 6 | 6 | 6 | 6 | 6 | 6 |
| PAG-2 | 2 | 2 | 2 | 2 | 2 | 2 |
| Softening accelerator 2 | 10 | — | — | — | — | — |
| Softening accelerator 3 | — | 10 | — | — | — | — |
| Softening accelerator 4 | — | — | 10 | — | — | — |
| Softening accelerator 5 | — | — | — | 10 | — | — |
| Softening accelerator 6 | — | — | — | — | 10 | — |
| Softening accelerator 7 | — | — | — | — | — | 10 |
| PGMEA | 560 | 560 | 560 | 560 | 560 | 560 |
| EL | 1,300 | 1,300 | 1,300 | 1,300 | 1,300 | 1,300 |
| Surfactant A | 0.07 | 0.07 | 0.07 | 0.07 | 0.07 | 0.07 |
| N-compound A | 0.3 | 0.3 | 0.3 | 0.3 | 0.3 | 0.3 |
| N-compound B | 0.3 | 0.3 | 0.3 | 0.3 | 0.3 | 0.3 |
| PDHT | no | no | no | no | no | no |

TABLE 5

|  | Resolution (nm) | Cross-sectional profile | LER (nm) | Pattern size change (nm) |
|---|---|---|---|---|
| Example 2 | 50 | rectangular | 2.5 | 1.7 |
| Example 3 | 50 | rectangular | 1.5 | 2.0 |
| Example 4 | 50 | rectangular | 1.5 | 1.9 |
| Example 5 | 50 | rectangular | 1.5 | 2.1 |
| Example 6 | 50 | rectangular | 2.5 | 2.0 |
| Example 7 | 50 | rectangular | 2.5 | 1.8 |

TABLE 6

|  | Resolution (nm) | Cross-sectional profile | LER (nm) | Pattern size change (nm) |
|---|---|---|---|---|
| Comparative Example 4 | 50 | rectangular | 4 | — |
| Comparative Example 5 | 50 | rectangular | 3 | — |
| Comparative Example 6 | 50 | rectangular | 3 | — |
| Comparative Example 7 | 50 | rectangular | 3 | — |
| Comparative Example 8 | 50 | rectangular | 4 | — |
| Comparative Example 9 | 50 | rectangular | 4 | — |

Even when Softening accelerators 2 to 7 were used instead, satisfactory patterns comparable to Example 1 were obtained, that is, a LER improvement was achieved. Examples 2 to 7 all provide a LER improvement of 1.5 nm over Comparative Examples 4 to 9 without PDHT.

Examples 8 to 14 & Comparative Examples 10, 11

Resist compositions of Table 7 were prepared. PGME was additionally used as the solvent to form a lower concentration solution in order to form a thinner resist film.

Pattern formation was the same as in Example 1 including the step of spin coating the resist solution onto a mask blank. Because of a lower concentration, the thickness of a resist film was reduced to 90 nm under the same coating condictions. Resolution and pattern profile were evaluated.

The test results of resolution, cross-sectional profile, LER, and pattern size change are shown in Table 8. Because of the reduced film thickness, a 40-nm pattern could be resolved without collapse.

TABLE 7

| Formulation (pbw) | Example | | | | | | | Comparative Example | |
|---|---|---|---|---|---|---|---|---|---|
|  | 8 | 9 | 10 | 11 | 12 | 13 | 14 | 10 | 11 |
| Polymer 1 | 80 | 80 | 80 | 80 | 80 | 80 | 80 | 80 | 80 |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Softening accelerator 1 | 10 | — | — | — | — | — | — | 10 | — |
| Softening accelerator 2 | — | 10 | — | — | — | — | — | — | — |
| Softening accelerator 3 | — | — | 10 | — | — | — | — | — | — |
| Softening accelerator 4 | — | — | — | 10 | — | — | — | — | — |
| Softening accelerator 5 | — | — | — | — | 10 | — | — | — | — |
| Softening accelerator 6 | — | — | — | — | — | 10 | — | — | — |
| Softening accelerator 7 | — | — | — | — | — | — | 10 | — | — |
| PGMEA | 980 | 980 | 980 | 980 | 980 | 980 | 980 | 980 | 980 |
| EL | 980 | 980 | 980 | 980 | 980 | 980 | 980 | 980 | 980 |
| PGME | 1,300 | 1,300 | 1,300 | 1,300 | 1,300 | 1,300 | 1,300 | 1,300 | 1,300 |
| Surfactant A | 0.07 | 0.07 | 0.07 | 0.07 | 0.07 | 0.07 | 0.07 | 0.07 | 0.07 |
| N-compound A | 0.3 | 0.3 | 0.3 | 0.3 | 0.3 | 0.3 | 0.3 | 0.3 | 0.3 |
| N-compound B | 0.3 | 0.3 | 0.3 | 0.3 | 0.3 | 0.3 | 0.3 | 0.3 | 0.3 |
| PDHT | yes | yes | yes | yes | yes | yes | yes | no | yes |

TABLE 8

|  | Resolution (nm) | Cross-sectional profile | LER (nm) | Pattern size change (nm) |
|---|---|---|---|---|
| Example 8 | 40 | rectangular | 3.5 | 1.6 |
| Example 9 | 40 | rectangular | 3.5 | 1.8 |
| Example 10 | 40 | rectangular | 2.5 | 2.1 |
| Example 11 | 40 | rectangular | 2.5 | 2.0 |
| Example 12 | 40 | rectangular | 2.5 | 2.2 |
| Example 13 | 40 | rectangular | 3.5 | 2.1 |
| Example 14 | 40 | rectangular | 3.5 | 1.9 |
| Comparative Example 10 | 40 | rectangular | 4.5 | — |
| Comparative Example 11 | 40 | rectangular | 6.0 | 1.2 |

It is seen that the prior art resist composition (Comparative Example 11) suffered a problem that a reduced film thickness resulted in an increased LER. In contrast, the resist compositions having a low molecular weight softening accelerator added thereto were effective in forming a thin film of less than 100 nm, and through PDHT, they achieved improvements in LER over the LER value of 4.5 for Comparative Example 10 without PDHT.

Examples 15, 16 & Comparative Examples 12 to 14

A pattern size change and LER were evaluated as a function of the PDHT temperature. Resist compositions of Example 1 and Comparative Example 2 (in Table 1) were prepared, for which a change of pattern size and LER were evaluated as well as a thickness loss of resist film pattern by PDHT.

Pattern formation was the same as in Example 1 including the step of spin coating the resist solution onto a mask blank. A pattern with a line width of 50 nm was formed. The PDHT conditions included a temperature of 120° C., 130° C., 140° C., 150° C. and 160° C. and a time of 10 minutes at each temperature (Table 9).

The test results of cross-sectional profile, LER, film thickness loss, and pattern size change are shown in Table 10.

TABLE 9

|  | Example | | | | Comparative Example | |
| --- | --- | --- | --- | --- | --- | --- |
|  | 1 | 15 | 16 | 17 | 12 | 13 |
| Resist composition | Example 1 | Example 1 | Example 1 | Example 1 | Example 1 | Comparative Example 2 |
| PDHT temperature | 130° C. | 120° C. | 140° C. | 150° C. | 160° C. | 60° C. |

TABLE 10

|  | Cross-sectional profile | LER (nm) | Film loss (nm) | Pattern size change (nm) |
| --- | --- | --- | --- | --- |
| Example 1 | rectangular | 2.5 | 1 | 1.5 |
| Example 15 | rectangular | 3.5 | 1 | 1 |
| Example 16 | rectangular | 2.4 | 1.5 | 2 |
| Example 17 | somewhat rounded top | 2.2 | 2.5 | 3 |
| Comparative Example 12 | rounded top | 1.3 | 5 | 6 |
| Comparative Example 13 | rounded top | 4.5 | 5 | 6 |

The resist composition of Example 1 provided a LER of 4 nm when PDHT was omitted (see Comparative Example 1). Example 15 at a PDHT temperature of 120° C. which was 10° C. higher than the PEB temperature showed an improvement of LER without degradation of pattern profile although a reduction of LER was only 0.5 nm. Example 1 at a PDHT temperature of 130° C. provided a LER improvement of 1.5 nm, while the film thickness loss was limited to 1 nm, and the pattern size change associated with the film loss was limited to 1.5 nm. It is evident that LER is improved without substantial degradation of pattern profile.

When the PDHT temperature was elevated to 140° C. (Example 16), LER was improved although the film loss and pattern size change were increased. The percent pattern size change was within 5% of the given size and fully acceptable, and the pattern profile was kept rectangular. When the PDHT temperature was elevated to 150° C. (Example 17), the 50-nm pattern experienced a size change of 3 nm, indicating a percent size change of more than 5%, and the pattern profile was somewhat rounded at the top. This profile, despite a rather undesirable change, is not yet degraded to the profile that is incompatible with subsequent etching of the processable substrate using the resist pattern.

When the PDHT temperature was elevated to 160° C. (Comparative Example 12), the percent line width change exceeded 10%, and the pattern profile was rounded at the top. Even if the resist pattern resulting from development was estimated by taking into account such a line width increase, the resulting pattern was undesirable for subsequent etching. In Comparative Example 13 using the softening accelerator-free resist composition, LER is not improved at all at a PDHT temperature of 130° C.; and at a PDHT temperature of 160° C., the LER improvement was insufficient and the resist pattern profile was degraded. It was found that the temperature span within which LER was improved without degrading the pattern profile was very narrow.

Examples 18 to 20 & Comparative Examples 14, 15

A relation of an amount of the softening accelerator in the resist composition to the PDHT temperature capable of LER improvement was examined. Resist compositions of Table 11 were prepared and evaluated with respect to the PDHT temperature capable of LER improvement and a change of pattern size.

Pattern formation was the same as in Example 1 including the step of spin coating the resist solution onto a mask blank. A pattern with a line width of 50 nm was formed. The PDHT conditions included a temperature of 120° C., 130° C., and 140° C. and a time of 10 minutes at each temperature (Table 12).

The test results of cross-sectional profile, LER, and pattern size change are shown in Table 12 along with the PDHT temperature capable of LER improvement.

TABLE 11

| Formulation (pbw) | Example | | | | Comparative Example | |
| --- | --- | --- | --- | --- | --- | --- |
|  | 1 | 18 | 19 | 20 | 14 | 15 |
| Polymer 1 | 80 | 80 | 80 | 80 | 80 | 80 |
| PAG-1 | 6 | 6 | 6 | 6 | 6 | 6 |
| PAG-2 | 2 | 2 | 2 | 2 | 2 | 2 |
| PGMEA | 560 | 560 | 560 | 560 | 560 | 560 |
| EL | 1,300 | 1,300 | 1,300 | 1,300 | 1,300 | 1,300 |
| Softening accelerator 1 | 10 | 5 | 15 | 20 | 25 | 2 |
| Surfactant A | 0.07 | 0.07 | 0.07 | 0.07 | 0.07 | 0.07 |
| N-compound A | 0.3 | 0.3 | 0.3 | 0.3 | 0.3 | 0.3 |
| N-compound B | 0.3 | 0.3 | 0.3 | 0.3 | 0.3 | 0.3 |

TABLE 12

| | PDHT temperature (° C.) | Cross-sectional profile | LER (nm) | Pattern size change (nm) |
|---|---|---|---|---|
| Example 1 | 130 | rectangular | 2.5 | 1.5 |
| Example 18 | 140 | rectangular | 3.0 | 2 |
| Example 19 | 130 | rectangular | 2.5 | 1.5 |
| Example 20 | 120 | rectangular | 2.0 | 2.0 |
| Comparative Example 14 | 120 | wavy | 2.5 | 3.0 |
| Comparative Example 15 | 140 | rectangular | 4.0 | 2.0 |

While the PDHT temperature capable of LER improvement for Example 1 is 130° C., the PDHT temperature lowers as the amount of Softening accelerator 1 is increased. However, when the amount of Softening accelerator 1 added exceeds 20 wt % based on the total solids in the resist composition (Comparative Example 14), the pattern profile becomes wavy, indicating that an excess of softening accelerator exerts deleterious effects during the pattern formation. Inversely, when the amount of Softening accelerator 1 added is less than 2.5 wt % based on the total solids in the resist composition (Comparative Example 15), LER is not improved even at a PDHT temperature of 140° C., indicating that least effects are derived from the softening accelerator.

For reference, it is described how to synthesize acid-decomposable keto ester compounds of steroid skeleton. Me stands for methyl.

Reference Example 1

Synthesis of 1-ethylcyclopentyloxycarbonylmethyl dehydrocholate (A-1)

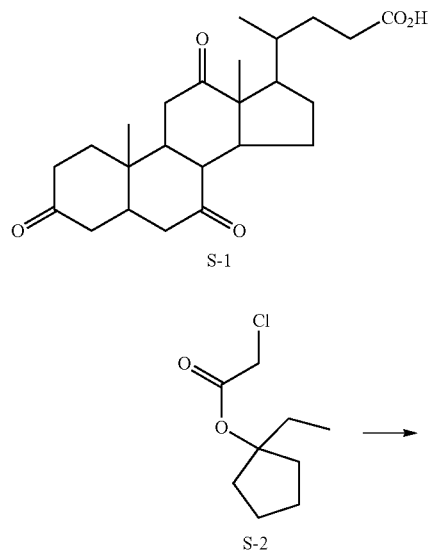

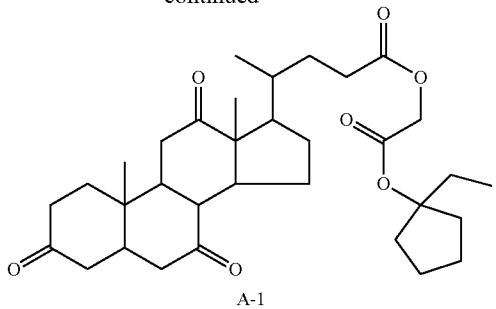

A mixture of 4.0 g of dehydrocholic acid (S-1), 2.9 g of 1-ethylcyclopentyl chloroacetate (S-2), 1.2 g of triethylamine, 0.2 g of sodium iodide, and 24 g of dimethylformamide was stirred at 80° C. for 48 hours. The reaction mixture was diluted with methylene chloride, subjected to an ordinary aqueous workup, and purified by column chromatography, yielding 4.3 g of 1-ethylcyclopentyloxycarbonylmethyl dehydrocholate (A-1).

Reference Example 2

Synthesis of 1-ethylcyclopentyl dehydrocholate (A-2)

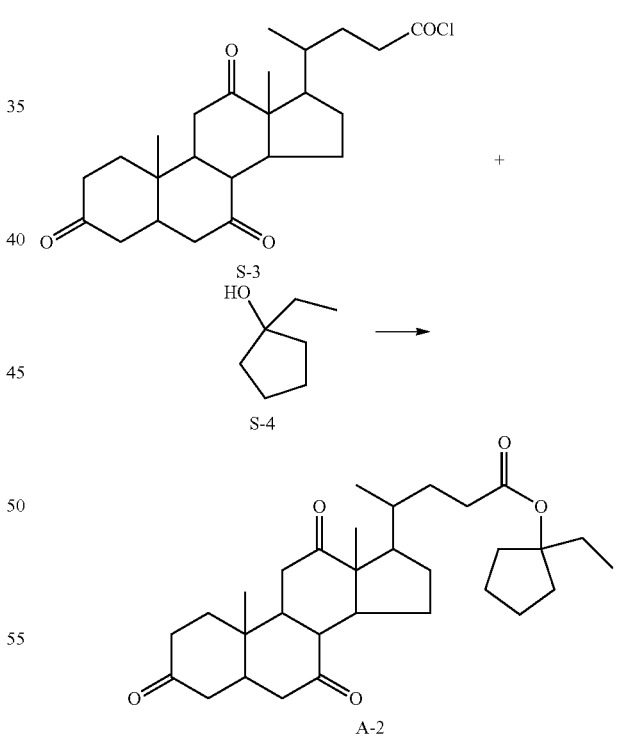

A mixture of 4.2 g of dehydrocholic acid chloride (S-3), 1.7 g of 1-ethylcyclopentanol (S-4), 0.1 g of 4-dimethylaminopyridine, and 16 g of pyridine was stirred at 60° C. for 16 hours. The reaction mixture was diluted with methylene chloride, subjected to an ordinary aqueous workup, and purified by column chromatography, yielding 3.5 g of 1-ethylcyclopentyl dehydrocholate (A-2).

Reference Example 3

Synthesis of 1-methoxy-2-methylpropyl dehydrocholate (A-3)

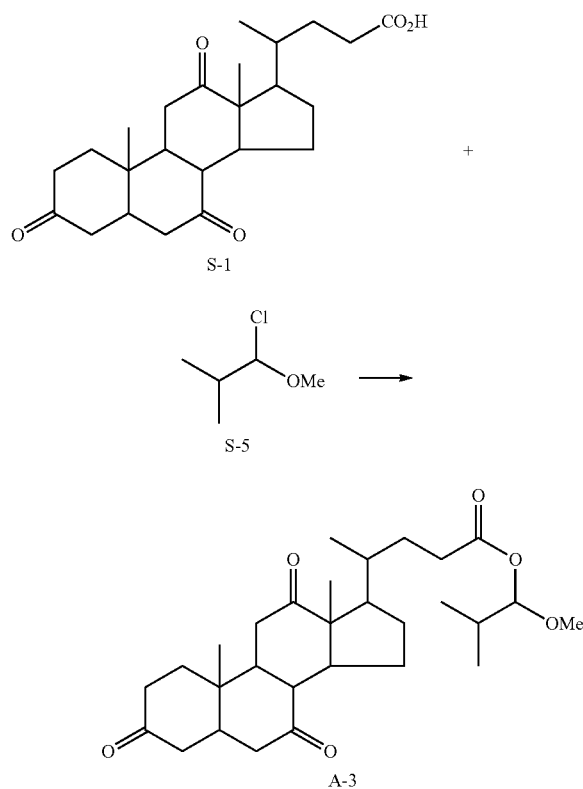

At room temperature, 6.1 g of 1-chloro-2-methylpropyl methyl ether (S-5) was added dropwise to a mixture of 20.0 g of dehydrocholic acid (S-1), 6.0 g of triethylamine, and 100 g of tetrahydrofuran, followed by stirring for 1 hour. The reaction mixture was diluted with toluene. After an ordinary aqueous workup, the solvent was distilled off in vacuum. The resulting solid was washed with isopropyl ether and dried in vacuum, yielding 21.9 g of 1-methoxy-2-methylpropyl dehydrocholate (A-3).

The target compound was analyzed by infrared (IR) absorption spectroscopy and nuclear magnetic resonance spectroscopy ($^1$H-NMR), with the results shown below. Note that the compound is a mixture of two diastereomers in a ratio of 1:1.

IR (D-ATR): ν=2964, 2931, 2872, 1740, 1720, 1705, 1470, 1426, 1384, 1314, 1299, 1277, 1250, 1220, 1170, 1138, 1120, 1097, 972, 946, 911 cm$^{-1}$ $^1$H-NMR (600 MHz, THF-d8): δ=0.86 (3H, d, J=6.4 Hz), 0.88-0.92 (6H, m), 1.08 (3H, s), 1.22-1.42 (7H, m, inclusive of 1.40 (3H, s)), 1.55 (1H, dt, J=14.7, 4.1 Hz), 1.76-2.06 (9H, m), 2.09 (1H, dd, J=12.4, 5.5 Hz), 2.20 (1H, t, J=13.2 Hz), 2.23-2.52 (6H, m), 2.86 (1H, t, J=12.8 Hz), 2.96 (1H, dd, J=13.3, 5.5 Hz), 2.99 (1H, t, J=11.9 Hz), 3.32 (1.5H, s), 3.33 (1.5H, s), 5.52 (1H, d, J=5.0 Hz)

Reference Example 4

Synthesis of 2-methyl-1-(tricyclo[5.2.1.0$^{2,6}$]decan-8-yloxy)-propyl dehydrocholate (A-4)

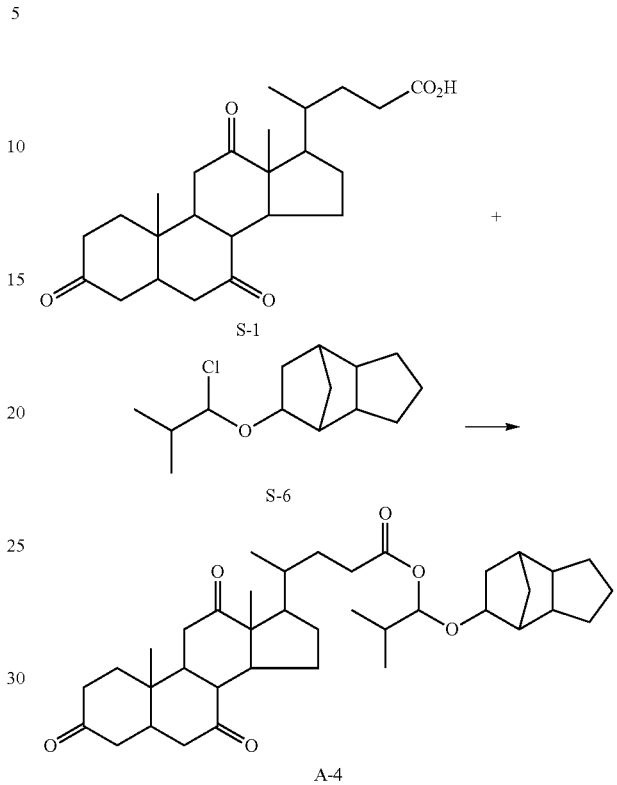

Synthesis was carried out as in Reference Example 3 aside from using an equimolar amount of 1-chloro-2-methylpropyl tricyclo[5.2.1.0$^{2,6}$]decan-8-yl ether (S-6) instead of 1-chloro-2-methylpropyl methyl ether (S-5). There was obtained 2-methyl-1-(tricyclo[5.2.1.0$^{2,6}$]decan-8-yloxy)propyl dehydrocholate (A-4).

Japanese Patent Application No. 2011-017840 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist pattern forming process comprising the steps of:
   (i) coating a chemically amplified positive resist composition onto a processable substrate, the resist composition comprising (A) a base resin having an acidic functional group protected with an acid labile group, which is substantially alkali insoluble, but turns alkali soluble when the acid labile group is eliminated, (B) an acid generator, (C) a nitrogen-containing compound as a basic component, and (D) an organic solvent, and prebaking to remove an excess of the solvent and form a resist film,
   (ii) exposing the resist film imagewise to high-energy radiation,
   (iii) optionally baking and developing with a developer to form a resist pattern, and
   (iv) heating the developed pattern for pattern profile correction to such an extent that the line width of the developed pattern may not undergo a change of at least 10%, said resist composition further comprising (E) a softening accelerator having an acidic functional group protected with an acid labile group and a molecular weight of up to 800 in an amount of 2.5% to 20% by weight based on the total solids of the resist composition.

2. The process of claim 1 wherein said softening accelerator is a compound having at least two 5 or 6-membered rings and a free-rotatable carbon chain of at least two carbon atoms.

3. The process of claim 1 wherein said softening accelerator is a compound having the general formula (1):

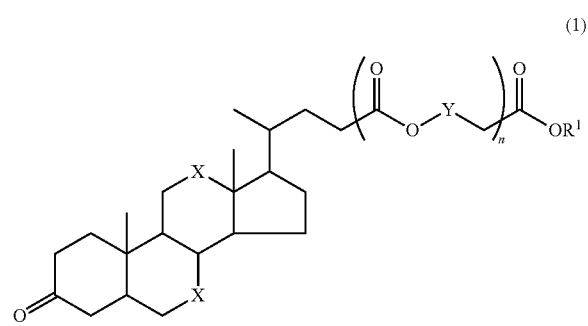

(1)

wherein $R^1$ is such an acid labile group having 2 to 20 carbon atoms and optional oxygen atom that —COOR$^1$ is decomposed to generate carboxyl under the action of acid, X is each independently a carbonyl group (—CO—) or methylene group (—CH$_2$—), Y is each independently a single bond or a $C_1$-$C_6$ alkylene group, and n is an integer of 0 to 2.

4. The process of claim 3 wherein $R^1$ in formula (1) is an acetal group having the general formula (2):

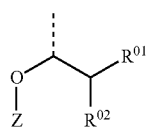

(2)

wherein the broken line denotes a valence bond, $R^{01}$ and $R^{02}$ are each independently hydrogen or a straight, branched or cyclic $C_1$-$C_{10}$ alkyl group, or $R^{01}$ and $R^{02}$ may bond together to form a cyclic structure with the carbon atom to which they are attached, and Z is a monovalent $C_1$-$C_{20}$ hydrocarbon group which may contain an oxygen atom.

5. The process of claim 3 wherein the softening accelerator has the general formula (3):

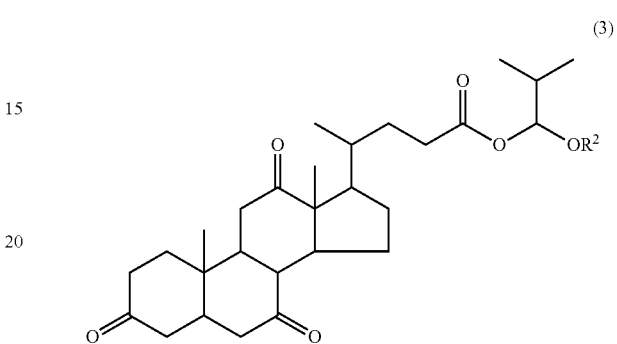

(3)

wherein $R^2$ is a straight, branched or cyclic monovalent hydrocarbon group which may contain an oxygen atom and in which the sum of carbon and oxygen atoms is 1 to 15.

6. The process of claim 1 wherein the processable substrate is a photomask blank.

7. The process of claim 1 wherein the post-develop heat treatment is carried out at a temperature which is higher than the post-exposure bake temperature.

8. The process of claim 1 wherein the softening accelerator is selected from bisphenols, low molecular weight polyhydroxystyrenes with a molecular weight of up to 800 and bisphenol acid esters, which are protected with an acid labile group, and sesquiterpenes, diterpenes, triterpenes and derivatives thereof having at least two rings and acid labile group-protected carboxylic acid.

* * * * *